(12) United States Patent
Yuzurihara et al.

(10) Patent No.: US 6,211,749 B1
(45) Date of Patent: Apr. 3, 2001

(54) IMPEDANCE MATCHING DEVICE

(75) Inventors: Itsuo Yuzurihara; Satoru Matsukawa, both of Yokohama (JP)

(73) Assignee: Kyosan Electric Mfg. Co., Ltd., Yokohama (JP)

( * ) Notice: Subject to any disclaimer, the term of this patent is extended or adjusted under 35 U.S.C. 154(b) by 0 days.

(21) Appl. No.: 09/310,119

(22) Filed: May 12, 1999

(30) Foreign Application Priority Data

Nov. 27, 1998 (JP) .................................................. 10-338208

(51) Int. Cl.[7] ......................................................... H03H 7/40
(52) U.S. Cl. .......................... 333/17.3; 333/32; 336/155; 336/184
(58) Field of Search ...................... 333/17.3, 22; 334/11, 334/12, 14, 71; 336/155, 184

(56) References Cited

U.S. PATENT DOCUMENTS

| | | | | |
|---|---|---|---|---|
| 2,884,632 | * | 4/1959 | Dewritz et al. | 333/17.3 X |
| 3,430,175 | * | 2/1969 | Matsuoka et al. | 334/12 X |
| 3,489,970 | * | 1/1970 | Wanlass | 334/71 X |
| 3,631,534 | * | 12/1971 | Hirota et al. | 336/155 |
| 3,913,583 | * | 10/1975 | Bross | 336/155 X |
| 4,630,013 | * | 12/1986 | Takada | 334/12 |
| 4,965,607 | * | 10/1990 | Wilkins et al. | 333/17.3 X |
| 5,187,454 | * | 2/1993 | Collins et al. | 333/32 X |

FOREIGN PATENT DOCUMENTS

| | | |
|---|---|---|
| 47-40375 | 6/1972 | (JP) . |
| 51-71955 | 6/1976 | (JP) . |
| 0165514 | 4/1989 | (JP) . |
| 5-063604 | 3/1993 | (JP) . |
| 6-096967 | 4/1994 | (JP) . |
| 8-55733 | 2/1996 | (JP) . |

* cited by examiner

*Primary Examiner*—Benny Lee
*Assistant Examiner*—Stephen E. Jones

(57) ABSTRACT

An impedance matching device provided between a high-frequency generator and a load device matches an impedance of the high-frequency generator with an impedance of the load device and includes at least a coupled circuit which comprises a core, and a main winding and a control winding which are wound around the core. The coupled circuit changes an impedance of the impedance matching device by changing an inductance value of the main winding which depends on a magnitude of direct current flowing in the control winding.

19 Claims, 11 Drawing Sheets

TOROIDAL CORE

U-SHAPED CORE

SPECTACLE CORE

E-SHAPED CORE

IMPEDANCE MATCHING DEVICE

BACKGROUND OF THE INVENTION

1. Field of the Invention

The present invention relates to an impedance matching device for matching the impedance of a high-frequency (radio-frequency) generator with the impedance of a load device.

2. Description of Related Art

If the impedance of the high-frequency generator is not matched with the impedance of the load device while supplying a high-frequency power from the high-frequency generator into the load device, the supply efficiency of the high-frequency power from high-frequency generator to the load device is low.

The impedance value of the high-frequency generator is a fixed value, e.g., 50 (Ω) or 75 (Ω). On the other hand, the impedance value of the load device not only varies widely depending on the structure thereof and its installation condition, but varies widely for a short time depending on a physical change caused inside by the high-frequency power applied to the load device, e.g., a temperature rise and the like, and also depending on a chemical change, e.g., generation of a gas and the like, caused by decomposition of a part of the raw material of the components in the load device.

In order to match the impedance of the high-frequency generator with the impedance of the load device, an impedance matching device is generally provided between the high-frequency generator and the load device.

Next, an earlier developed impedance matching device provided between the high-frequency generator and the load device will be explained with reference to FIGS. 12A to 12H.

FIGS. 12A to 12H are views showing circuit constructions of the main part of the earlier developed impedance matching device.

Although FIGS. 12A to 12H show a plurality of circuit constructions, because the fundamental circuit functions of the constructions are substantially the same, only the construction shown in FIG. 12A will be explained and the explanation for FIGS. 12B to 12H will be omitted.

Each of the impedance matching device shown in FIGS. 12A to 12H comprises a variable capacitance element VC and a variable inductance element VL.

An end of the variable capacitance element VC is connected to a terminal "a" and the other end thereof is connected to terminals "b" and "d". An end of the variable inductance element VL is connected to terminals "a" and an end of the variable capacitance element VC, and the other end of the variable inductance element VL is connected to a terminal "c".

For example, between the terminals "a" and "b", a high-frequency generator which is not shown is connected; and the terminals "c" and "d", a load device which is not shown is connected.

In order to match the impedance of the high-frequency generator with the impedance of the load device, the capacitance value of the variable capacitance element VC and the inductance value of the variable inductance element VL are changed.

Although a detailed explanation for the method is omitted, the standing wave between the terminals "a" and "b" is measured, and a voltage standing wave ratio circuit is operated on the basis of the measurement result. Thereafter, the capacitance value of the variable capacitance element VC, and the inductance value of the variable inductance element VL are computed to match the impedance of the high-frequency generator with the impedance of the load device. According to the computation result, the capacitance value of the variable capacitance element VC and the inductance value of the variable inductance element VL are changed.

However, in the above-described earlier developed impedance matching device, because the high-frequency power for industrial use is not less than several tens of watts, a variable capacitor is used as the variable capacitance element VC, and the capacitance value of the variable capacitor is changed by using a motor. The inductance value of a coil which is used as the variable inductance element VL is changed by moving a contact (slider) on the coil by using a motor.

According to the above-described method in which the capacitance value of the variable capacitor used as the variable capacitance element VC and the inductance value of a coil used as the variable inductance element VL are changed by using a motor, a great amount of time is necessary to match the impedance of the high-frequency generator with the impedance of the load device because the speed available to change the capacitance value and the inductance value is restricted by the operating speed of the motor.

There is another problem that when the impedance of the load device has suddenly changed after matching of the impedance of the high-frequency generator and the impedance of the load device was carried out, changing of the capacitance value of the variable capacitor used as the variable capacitance element VC and the inductance value of a coil used as the variable inductance element VL cannot follow the sudden change of the impedance of the load device.

There is a further problem that maintenance operations, e.g., a routine lubrication, a replacement of consumable parts and the like, are required.

SUMMARY OF THE INVENTION

The present invention was developed in view of these problems. It is therefore an object of the present invention to provide an impedance matching device which enables changing the inductance value and the like at a high speed and matching the impedance of the high-frequency generator with the impedance of the load device at a high speed. Another object of the present invention is to provide an impedance matching device which does not require maintenance operations.

In accordance with an aspect of the present invention, the impedance matching device which is provided between a high-frequency generator and a load device, for matching an impedance of the high-frequency generator with an impedance of the load device, comprises; at least a coupled circuit which comprises a core, and a main winding and a control winding which are wound around the core; the coupled circuit changing an impedance of the impedance matching device by changing an inductance value of the main winding which depends on a magnitude of a direct current flowing in the control winding.

According to the invention, because the impedance of the impedance matching device is changed by changing the inductance of the main winding in the coupled circuit by changing the current value which flows in the control winding in the coupled circuit, it is possible to enable matching of the impedance of the device at a higher speed than an earlier developed impedance matching device which performs matching by changing the impedance mechanically by using a motor or the like; and it does not require maintenance operations.

In accordance with another aspect of the present invention, the impedance matching device, which is provided between a high-frequency generator and a load device, for matching an impedance of the high-frequency generator with an impedance of the load device, comprises at least a coupled circuit which includes a first core, a first main winding wound around the first core, a second core, a second main winding wound around the second core, and a control winding wound around the first and second cores, both the first and second cores passing through each turn of the control winding; wherein an impedance of the impedance matching device is changed by changing inductance values of the first and second main windings which depend on a magnitude of a direct current flowing in the control winding.

According to the invention, because the impedance of the impedance matching device is changed by changing the inductance of the first and second main windings by changing the current value which flows in the control winding in the coupled circuit, it is possible to enable matching of the impedance of the device at a higher speed than an earlier developed impedance matching device which performs matching by changing the impedance mechanically by using a motor or the like; and it does not require maintenance operations.

Further, because the high-frequency components generated in the control winding by high-frequency currents flowing in the first and second main windings are cancelled by each other and removed at every term of the control winding, a large voltage which was locally generated at the control winding in the case of the second or third embodiment, does not occur at the first control winding. Accordingly, it is possible to prevent dielectric breakdown of the coupled circuit.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Embodiments of the impedance matching device of the invention will be explained in detail with reference to the drawings, as follows.

Before explaining the embodiments of the impedance matching device of the invention, means for changing the inductance value (L) to match the impedance of the high-frequency generator with the impedance of the load device will be explained with reference to FIGS. 1 and 2.

Figure 1:
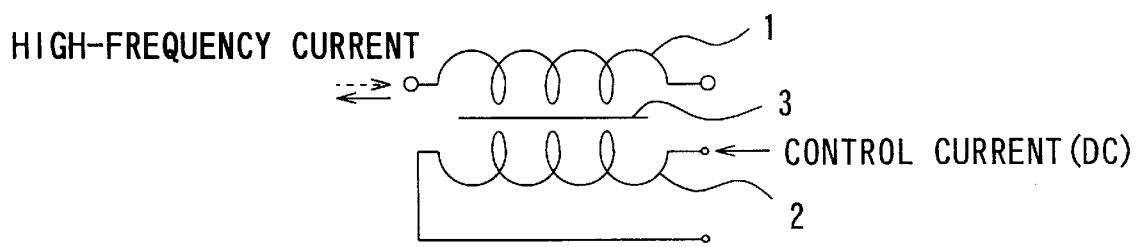
FIG. 1 is a view for explaining a circuit for changing the inductance.
Figure 2:
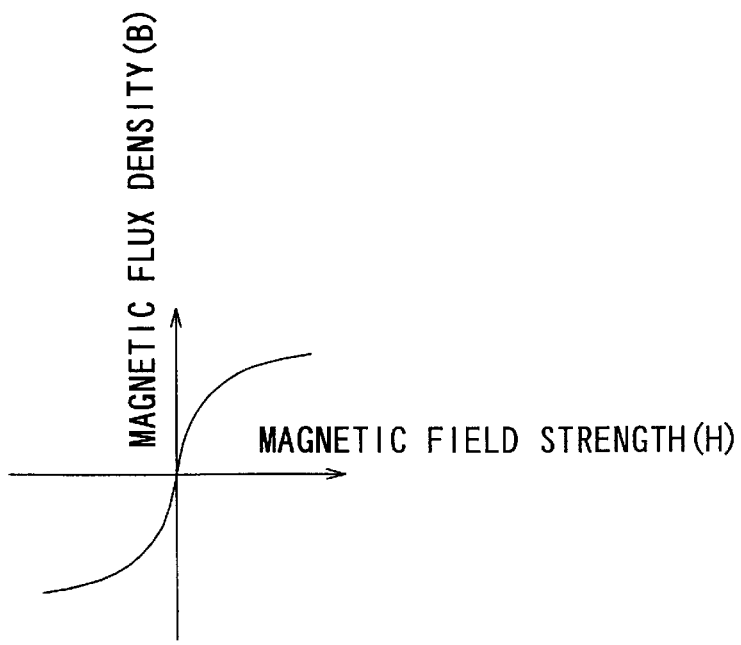
FIG. 2 is a B–H curve.

FIG. 1 is a view for explaining a circuit for changing the inductance, and FIG. 2 shows a B–H curve (which is also called as a magnetic saturation curve or a magnetization curve).

The circuit shown in FIG. 1 comprises a main winding 1, a control winding 2, and a core 3 such as a toroidal core or the like. The main winding 1 and the control winding 2 are wound around the core 3. The value of inductance (L) of the main winding 1 varies depending on the value of the control current which flows in the control winding 2.

This will be explained by using FIG. 2. Although an explanation about only a case of the magnetic field strength (H) being positive will be performed, substantially the same explanation can be applied about a case of the magnetic field strength (H) being negative.

In the B–H curve shown in FIG. 2, as the magnetic field strength (H) increases, the magnetic flux density B increases. However, as the magnetic field strength (H) increases, the ratio ($\Delta B/\Delta H$) of an infinitesimal increment ($\Delta B$) of the magnetic flux density B to the corresponding infinitesimal increment ($\Delta H$) of the magnetic field strength (H) decreases. That is, as the magnetic field strength (H) increases, the ratio (B/H) decreases.

The relationship among a magnetic field strength (H), a magnetic flux density B and a magnetic permeability ($\mu$) is given by the following equation.

$$B=\mu H$$

Therefore, as the magnetic field strength (H) increases, the magnetic permeability ($\mu$) decreases.

Because the value of inductance (L) is proportional to the value of magnetic permeability ($\mu$), the value of inductance (L) decreases as the magnetic permeability ($\mu$) decreases.

Therefore, when taking into consideration that, as the magnetic field strength (H) increases, the magnetic permeability ($\mu$) decreases, it is understood that the value of inductance (L) decreases as the magnetic field strength (H) increases.

Because the magnetic field strength (H) is proportional to the current value which flows in the coil, the magnetic field strength (H) increases as the current value which flows in the coil increases.

As described above, the value of inductance (L) decreases as the current value which flows in the coil increases.

Therefore, in the circuit shown in FIG. 1, the value of inductance (L) of the main winding 1 decreases as the value of the control current which flows in the control winding 2 increases; and it increases as the value of the control current which flows in the control winding 2 decreases.

In the following first to sixth embodiments, matching of the impedance of the high-frequency generator and the impedance of the load device is conducted by using the phenomenon that the value of inductance (L) of the main winding 1 depends on the value of the current which flows in the control winding 2.

In an actual B–H curve, the ratio (B/H) does not always decrease as the magnetic field strength (H) increases. However, it is possible to use the idea that the value of inductance (L) of a coil changes by changing the value of the current which flows in the coil.

First Embodiment

The impedance matching device according to the first embodiment of the invention will be explained with reference to FIG. 3.

Figure 3:
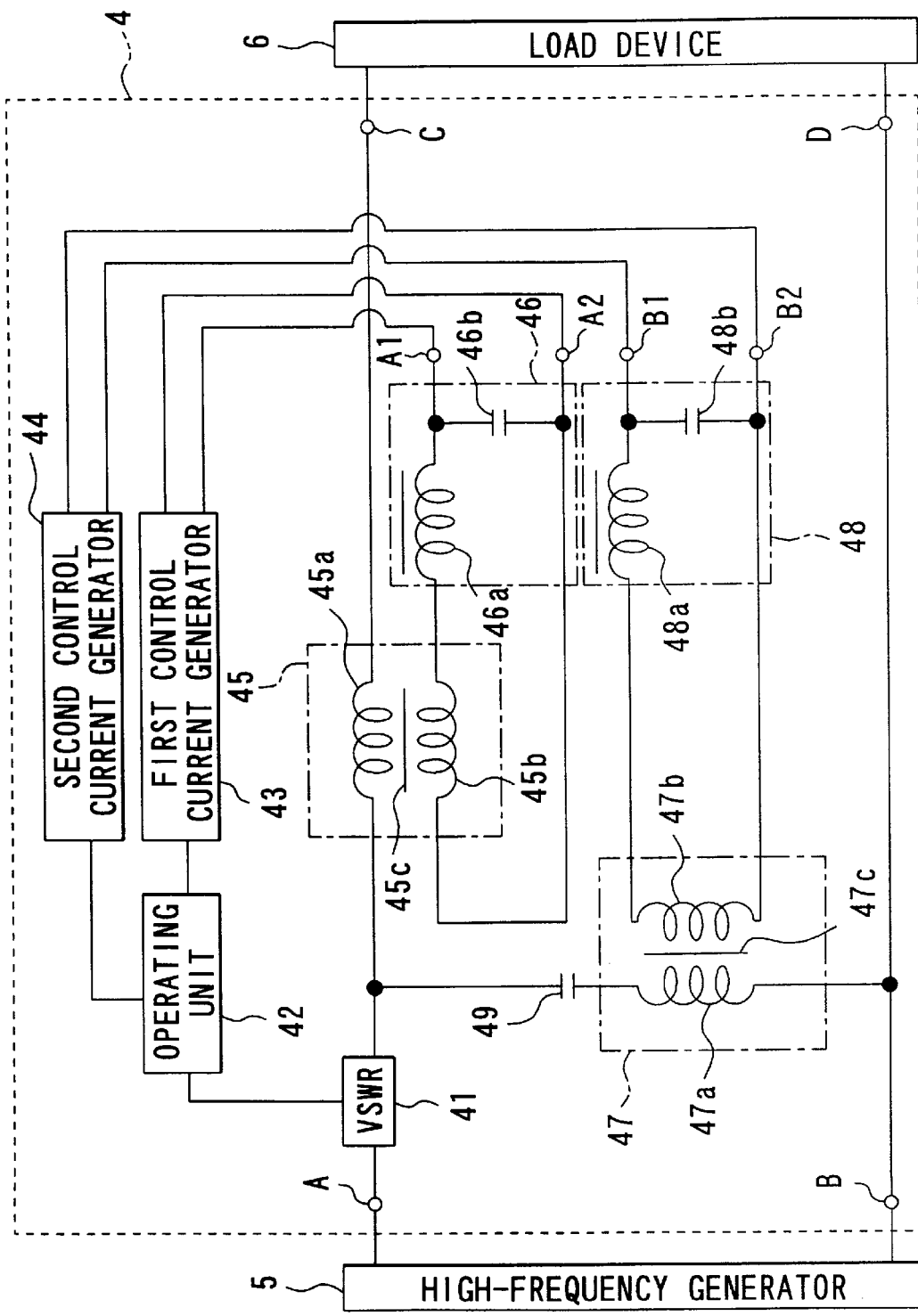
FIG. 3 is a block diagram of the principal circuit portion in the impedance matching device 4.

FIG. 3 is a block diagram of the principal circuit portion in the impedance matching device 4.

In FIG. 3, the reference numeral 5 denotes a high-frequency generator; and the reference numeral 6 denotes a load device. The impedance matching device 4 is for matching the impedance of the high-frequency generator 5 with the impedance of the load device 6 and is connected between the high-frequency generator 5 and the load device 6.

The impedance matching device 4 comprises a VSWR (Voltage Standing Wave Ratio) circuit 41, an operating unit 42, a first control current generator 43, a second control current generator 44, a first coupled circuit 45, a first low-pass filter 46, a second coupled circuit 47, a second low-pass filter 48, and a capacitor 49.

The VSWR circuit 41 is connected to a terminal "A" and a first main winding 45a which will be described later, of the first coupled circuit 45. The VSWR circuit 41 measures the standing wave which is created by return of a high-frequency voltage which was supplied from the high-frequency generator 5 to the load device 6, due to reflection off the load device 6; and operates the voltage standing wave ratio circuit on the basis of the measurement result, and thereafter outputs the operated voltage standing wave ratio to the operating unit 42.

The operating unit 42 controls the value of direct current (first control current) to be supplied to a first control winding 45b which will be described later, of the first coupled circuit 45 and controls the value of direct current (second control current) to be supplied to a second control winding 47b which will be described later, of the second coupled circuit 47, on the basis of the input voltage standing wave ratio from the VSWR circuit 41. The operating unit 42 outputs a first control signal representing the value of the first control current to the first control current generator 43, and outputs a second control signal representing the value of the second control current to the second control current generator 44.

The first control current generator 43 generates a first control current having the current value of the first control signal to output the generated first control current to terminals "A1" and "A2".

The second control current generator 44 generates a second control current having the current value of the second control signal to output the generated second control current to terminals "B1" and "B2".

The first coupled circuit 45 comprises a first core 45c, and a first main winding 45a and a first control winding 45b which are wound around the first core 45c.

In the first coupled circuit 45, an end of the first main winding 45a is connected to the VSWR circuit 41 and the other end thereof is connected to the terminal "C". An end of the first control winding 45b is connected to an end of a capacitor 46b which will described later, of the first low-pass filter 46, and the other end thereof is connected to an end of a coil 46a which will also be described later, of the first low-pass filter 46. In the first coupled circuit 45, the value of inductance (L) of the first main winding 45a is changed according to the first control current which is input from the first control current generator 43 through the first low-pass filter 46.

The first low-pass filter 46 is formed by an LC circuit which comprises the coil 46a and a capacitor 46b.

An end of the coil 46a is connected to an end of the first control winding 45b of the first coupled circuit 45, and the other end of the coil 46a is connected to the other end of the capacitor 46b and to the terminal "A1". An end of the capacitor 46b is connected to the other end of the first control winding 45b of the first coupled circuit 45 and to the terminal "A2", and the other end of the capacitor 46b is connected to the other end of the coil 46a and to the terminal "A1".

The first low-pass filter 46 is a filter for preventing application of a high-frequency component which is induced at the first control winding 45b, to the side of the first control current generator 43 when a high-frequency component, e.g., a high-frequency current or the like, is applied to the first main winding 45a of the first coupled circuit 45 from the high-frequency generator 5.

For example, if a high-frequency component, e.g., a high-frequency current or the like, is applied to an FET (Field Effect Transistor) which is used in the first control current generator 43, the FET may be damaged. In order to prevent such a damage, the first low-pass filter 46 is provided.

The second coupled circuit 47 comprises a second core 47c, and a second main winding 47a and a second control winding 47b which are wound around the second core 47c.

In the second coupled circuit 47, an end of the second main winding 47a is connected to an end of the capacitor 49 and the other end thereof is connected to the terminals "B" and "D". An end of the second control winding 47b is connected to an end of a coil 48a which will described later, of the second low-pass filter 48 and the other end thereof is connected to an end of a capacitor 48b which will described later, of second the low-pass filter 48. In the second coupled circuit 47, the value of inductance (L) of the second main winding 47a is changed according to the second control current which is input from the second control current generator 44 through the second low-pass filter 48.

The second low-pass filter 48 is formed by an LC circuit which comprises a coil 48a and a capacitor 48b.

An end of the coil 48a is connected to an end of the second control winding 47b of the second coupled circuit 47, and the other end of the coil 48a is connected to the other end of the capacitor 48b and to the terminal "B1". An end of the capacitor 48b is connected to the other end of the second control winding 47b of the second coupled circuit 47 and to the terminal "B2", and the other end of the capacitor 48b is connected to the other end of the coil 48a and to the terminal "B1".

The second low-pass filter 48 is a filter for preventing application of a high-frequency component which is induced at the second control winding 47b, to the side of the second control current generator 44 when a high-frequency component, e.g., a high-frequency current or the like, is applied to the second main winding 47a of the second coupled circuit 47 from the high-frequency generator 5.

For example, if a high-frequency component, e.g., a high-frequency current or the like, is applied to an FET (Field Effect Transistor) which is used in the second control current generator 44, the FET may be damaged. In order to prevent such a damage, the second low-pass filter 46 is provided.

An end of the capacitor 49 is connected to an end of the main winding 47a of the coupled circuit 47, and the other end of the capacitor 49 is connected to the VSWR circuit 41.

The capacitor 49 is provided to make a composite impedance of the second main winding 47a of the second coupled circuit 47 and the capacitor 49 "j×Y" (Y≦0) when the impedance of the first main winding 45a of the first coupled circuit 45 is "j×X" (X≧0).

In the impedance matching device 4, the value of inductance (L) of the first main winding 45a of the first coupled circuit 45 increases or decreases depending on the value of the first control current which is input into the first control winding 45b of the first coupled circuit 45 from the first control current generator 43. The value of inductance (L) of the second main winding 47a of the second coupled circuit 47 increases or decreases depending on the value of the second control current which is input into the second control winding 47b of the second coupled circuit 47 from the second control current generator 44. The impedance matching device 4 matches the impedance of the high-frequency generator 5 with the impedance of the load device 6 by using the inductance phenomenon to change the impedance of the impedance matching device 4.

In the impedance matching operation of the impedance matching device 4, for example, the imaginary part of the impedance of the high-frequency generator 5 and the impedance of the load device 6 may be adjusted by the first coupled circuit 45, and the real part of the impedance thereof may be adjusted by the second coupled circuit 47 and the capacitor 49.

The operation of the circuit having the above-described structure will be explained briefly.

When electric power is supplied to the load device 6 from the high-frequency generator 5, the VSWR circuit 41 measures the standing wave which is formed by the supplied high-frequency voltage being reflected back from the load device 6; and operates the voltage standing wave ratio circuit 41 on the basis of the measurement result, and thereafter outputs the operated voltage standing wave ratio to the operating unit 42.

The operating unit 42 controls the value of the first control current to be supplied to the first control winding 45b of the first coupled circuit 45 and the value of the second control current to be supplied to the second control winding 47b of the second coupled circuit 47, on the basis of the input voltage standing wave ratio from the VSWR circuit 41. The operating unit 42 outputs a first control signal representing the value of the first control current which is an operation result, to the first control current generator 43, and outputs a second control signal representing the value of the second control current which is an operation result, to the second control current generator 44.

The first control current generator 43 generates a first control current having the current value of the first control signal to output the generated first control current to terminals "A1" and "A2". The first control signal is input into the first control winding 45b of the first coupled circuit 45. The second control current generator 44 generates a second control current having the current value of the second control signal to output the generated second control current to terminals "B1" and "B2". The second control signal is input into the second control winding 47b of the second coupled circuit 47.

The value of inductance (L) of the first main winding 45a in the coupled circuit 45 is changed to a value corresponding to the value of the first control current which flows in the first control winding 45b; and the value of inductance (L) of the second main winding 47a in the second coupled circuit 47 is changed to a value corresponding to the value of the second control current which flows in the second control winding 47b.

Thus, the inductance (L) of the first main winding 45a in the first coupled circuit 45 and the inductance (L) of the second main winding 47a in the second coupled circuit 47 are changed to appropriate values, so that matching of the impedance of the high-frequency generator 5 and the impedance of the load device 6 is performed.

For example, when the impedance of the high-frequency generator 5 is 50 (Ω) and the impedance of the load device 6 is 25 (Ω), the operating unit 42 determines the values of the first and second control currents on the basis of the voltage standing wave ratio so that the impedance "j×X1" of the first main winding 45a of the first coupled circuit 45 meets the condition "j×X1=j×25 (Ω)" and the composite impedance "j×X2" of the capacitor 49 and the second main winding 47a of the second coupled circuit 47 meets the condition "j×X=−j×50 (Ω)".

In the impedance matching device 4 according to the first embodiment of the invention, the impedance of the impedance matching device 4 is changed by changing the inductance (L) of the first main winding 45a in the first coupled circuit 45 by changing the current value which flows in the first control winding 45b in the first coupled circuit 45, and by changing the inductance (L) of the second main winding 47a in the second coupled circuit 47 by changing the current value which flows in the second control winding 47b in the second coupled circuit 47. As a result, according to the impedance matching device 4 of the first embodiment, it is possible to enable matching of the impedance of the device at a higher speed than a conventional impedance matching device which performs matching by changing the impedance mechanically by using a motor or the like; and it does not require maintenance operations.

In the following second to sixth embodiments, only the circuit portions corresponding to the first coupled circuit 45, the first low-pass filter 46, the second coupled circuit 47, the second low-pass filter 48 and the capacitor 49, in the impedance matching device 4 will be explained. The circuit portions corresponding to the VSWR circuit 41, the operating unit 42, the first control current generator 43 and the second control current generator 44 will collectively be called a control circuit.

Second Embodiment

The impedance matching device according to the second embodiment of the invention will be explained with reference to FIG. 4.

Figure 4:
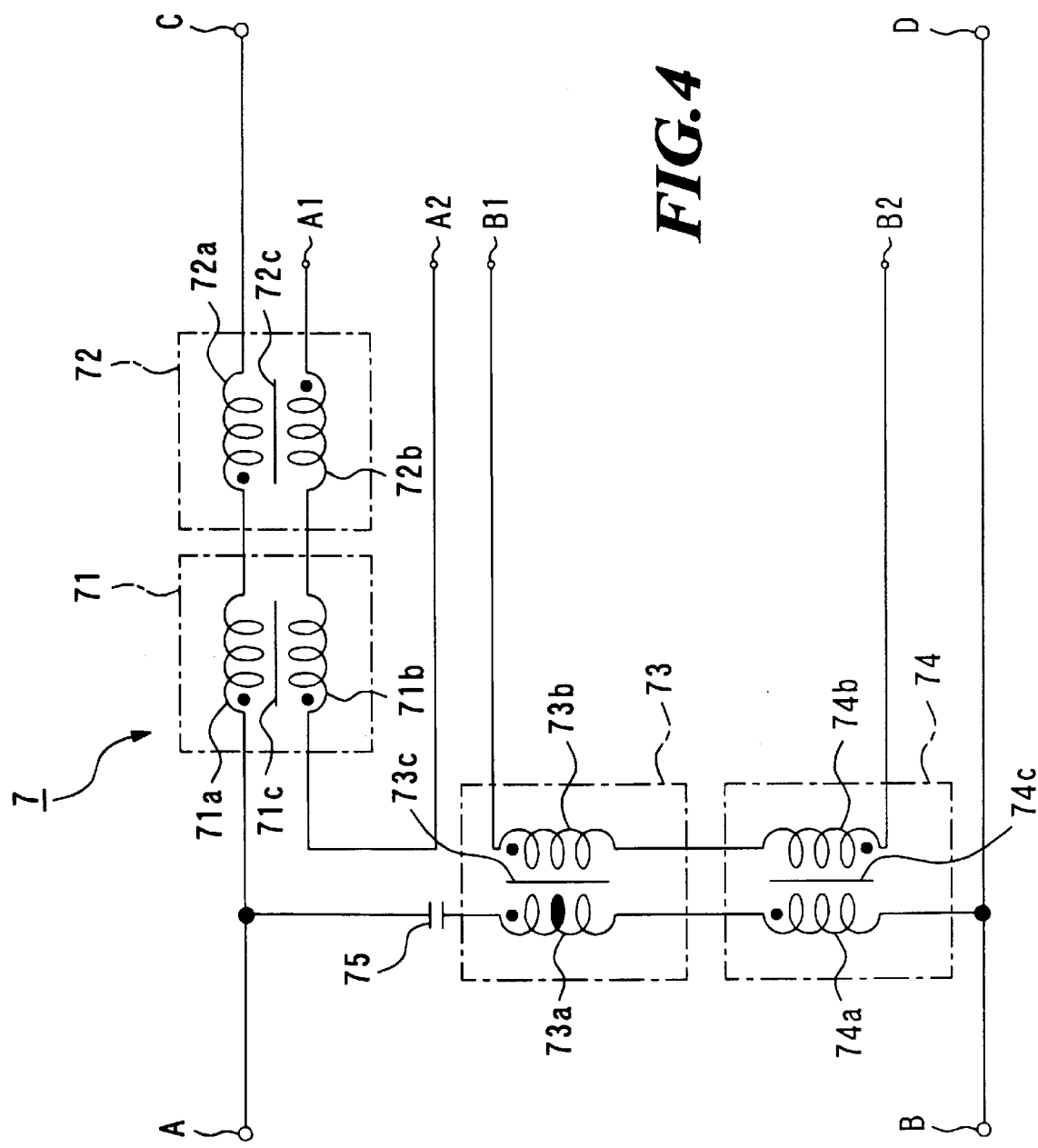
FIG. 4 is a block diagram of the principal circuit portion in the impedance matching device 7.

FIG. 4 is a block diagram of the principal circuit portion in the impedance matching device 7.

In the first embodiment as shown in FIG. 3, the high-frequency components generated by the coupled circuits (the first coupled circuit 45 and the second coupled circuit 47) are removed by the low-pass filters (the first low-pass filter 46 and the second low-pass filter 48) comprising an LC circuit. On the contrary, the impedance matching device according to the second embodiment of the invention comprises a pair of coupled circuits in which the winding directions of the control windings are different from each other, to cancel out the high-frequency components generated in the coupled circuits, instead of the circuit portions which comprise the coupled circuits and the low-pass filters.

The circuit construction of the impedance matching device 7 according to the second embodiment will be explained with reference to FIG. 4.

The circuit construction of the impedance matching device 7 comprises a first coupled circuit 71, a second coupled circuit 72, a third coupled circuit 73, a fourth coupled circuit 74, and a capacitor 75.

The first coupled circuit 71 comprises a first core 71c, and a first main winding 71a and a first control winding 71b which are wound around the first core 71c.

In the first coupled circuit 71, an end of the first main winding 71a is connected to a terminal "A", and the other end thereof is connected to an end of a second main winding 72a which will be described later, of the second coupled circuit 72. An end of the first control winding 71b is connected to a terminal "A2", and the other end thereof is connected to an end of a second control winding 72b which will be described later, of the second coupled circuit 72. In the first coupled circuit 71, the value of inductance (L) of the first main winding 71a is changed according to the control current which flows in the first control winding 71b from the control circuit.

The second coupled circuit 72 comprises a second core 72c, and a second main winding 72a and a second control winding 72b which are wound around the second core 72c.

In the second coupled circuit 72, an end of the second main winding 72a is connected to the other end of the first main winding 71a of the first coupled circuit 71, and the other end of the second main winding 72a is connected to a terminal "C". An end of the second control winding 72b is connected to the other end of the first control winding 71b of the first coupled circuit 71, and the other end of the second control winding 72b is connected to the terminal "A1". In the second coupled circuit 72, the value of inductance (L) of the second main winding 72a is changed according to the control current which flows in the second control winding 72b from the control circuit.

The relationship between the winding directions of the first main winding 71a and of the first control winding 71b, of the first coupled circuit 71 is the reverse of the relationship between the winding directions of the second main winding 72a and of the second control winding 72b, of the second coupled circuit 72. The winding number of the first main winding 71a of the first coupled circuit 71 is equal to that of the second main winding 72a of the second coupled circuit 72; and the winding number of the first control winding 71b of the first coupled circuit 71 is equal to that of the second control winding 72b of the second coupled circuit 72.

Because of the above-described relationships, the direction of the high-frequency component induced in the first control winding 71b by a high-frequency current flowing in the first main winding 71a of the first coupled circuit 71 is the reverse of the direction of the high-frequency component induced in the second control winding 72b by a high-frequency current flowing in the second main winding 72a of the second coupled circuit 72. The magnitude of the high-frequency component induced in the first control winding 71b by a high-frequency current flowing in the first main winding 71a of the first coupled circuit 71 is equal to that of the high-frequency component induced in the second control winding 72b by a high-frequency current flowing in the second main winding 72a of the second coupled circuit 72. As a result, the high-frequency components generated in the first control winding 71b and the second control winding 72b are cancelled and removed, so that it is possible to prevent the high-frequency components from being applied to the control circuit through the terminals A1 and A2.

The third coupled circuit 73 comprises a third core 73c, and a third main winding 73a and a third control winding 73b which are wound around the third core 73c.

In the third coupled circuit 73, an end of the third main winding 73a is connected to an end of a capacitor 75, and the other end of the third main winding 73a is connected to an end of a fourth main winding 74a which will be described later, of the fourth coupled circuit 74. An end of the third control winding 73b is connected to the terminal "B1" and the other end thereof is connected to an end of a fourth control winding 74b which will be described later, of the fourth coupled circuit 74. In the third coupled circuit 73, the value of inductance (L) of the third main winding 73a is changed according to the control current which flows in the third control winding 73b from the control circuit.

The fourth coupled circuit 74 comprises a fourth core 74c, and a fourth main winding 74a and a fourth control winding 74b which are wound around the fourth core 74c.

In the fourth coupled circuit 74, an end of the fourth main winding 74a is connected to the other end of the third main winding 73a of the third coupled circuit 73, and the other end of the fourth main winding 74a is connected to the terminals "B" and "D". An end of the fourth control winding 74b is connected to the other end of the third control winding 73b and the other end thereof is connected to the terminal "B2". In the fourth coupled circuit 74, the value of inductance (L) of the fourth main winding 74a is changed according to the control current which flows in the fourth control winding 74b from the control circuit.

The relationship between the winding directions of the third main winding 73a and of the third control winding 73b, of the third coupled circuit 73 is the reverse of the relationship between the winding directions of the fourth main winding 74a and of the fourth control winding 74b, of the fourth coupled circuit 74. The winding number of the third main winding 73a of the third coupled circuit 73 is equal to that of the fourth main winding 74a of the fourth coupled circuit 74; and the winding number of the third control winding 73b of the third coupled circuit 73 is equal to that of the fourth control winding 74b of the fourth coupled circuit 74.

Because of the above-described relationships, the direction of the high-frequency component induced in the third control winding 73b by a high-frequency current flowing in the third main winding 73a of the third coupled circuit 73 is the reverse of the direction of the high-frequency component induced in the fourth control winding 74b by a high-frequency current flowing in the fourth main winding 74a of the fourth coupled circuit 74. The magnitude of the high-frequency component induced in the third control winding 73b by a high-frequency current flowing in the third main winding 73a of the third coupled circuit 73 is equal to that of the high-frequency component induced in the fourth control winding 74b by a high-frequency current flowing in the fourth main winding 74a of the fourth coupled circuit 74. As a result, the high-frequency components generated in the third control winding 73b and the fourth control winding 74b are cancelled and removed, so that it is possible to prevent the high-frequency components from being applied to the control circuit through the terminals B1 and B2.

An end of the capacitor 75 is connected to an end of the third main winding 73a of the third coupled circuit 73, and the other end of the capacitor 75 is connected to the terminal "A". The reason for providing the capacitor 75 is the same as in the case of the first embodiment.

In the impedance matching device 7 according to the second embodiment of the invention, the value of inductance (L) of the first main winding 71a of the first coupled circuit 71 is changed depending on the value of the current which flows in the first control winding 71b of the first coupled circuit 71; the value of inductance (L) of the second main winding 72a of the second coupled circuit 72 is changed depending on the value of the current which flows in the second control winding 72b of the second coupled circuit 72; the value of inductance (L) of the third main winding 73a of the third coupled circuit 73 is changed depending on the value of the current which flows in the third control winding 73b of the third coupled circuit 73; and the value of inductance (L) of the main winding 74a of the fourth coupled circuit 74 is changed depending on the value of the current which flows in the control winding 74b of the fourth coupled circuit 74. The impedance matching device 4 matches the impedance of the high-frequency generator 5 with the impedance of the load device 6 by using the inductance phenomenon to change the impedance of the impedance matching device 7.

Detailed explanation of the circuit operation with respect to the impedance matching is omitted because the circuit operation and the idea of the second embodiment are similar to those of the impedance matching device 4 according to the first embodiment.

In the impedance matching device 7 according to the second embodiment of the invention, the impedance of the impedance matching device 7 is changed by changing the inductance (L) of the first main winding 71a in the first coupled circuit 71 by adjusting the current value which flows in the first control winding 71b in the first coupled circuit 71, by changing the inductance (L) of the second main winding 72a in the second coupled circuit 72 by adjusting the current value which flows in the second control winding 72b in the second coupled circuit 72, by changing the inductance (L) of the third main winding 73a in the third coupled circuit 73 by adjusting the current value which flows in the third control winding 73b in the third coupled circuit 73, and by changing the inductance (L) of the main winding 74a in the fourth coupled circuit 74 by adjusting the current value which flows in the control winding 74b in the fourth coupled circuit 74. As a result, according to the impedance matching device 7 of the second embodiment, it is possible to enable matching of the impedance of the device at a higher speed than a conventional impedance matching device which performs matching by changing the impedance mechanically by using a motor or the like; and it does not require maintenance operations.

Further, because the impedance matching device 7 of the second embodiment does not require first and second low-pass filters 46 and 48 for cutting the high-frequency components, which are used in the first embodiment, it is possible to decrease the production costs thereof.

Third Embodiment

The impedance matching device according to the third embodiment of the invention will be explained with reference to FIG. 5.

Figure 5:
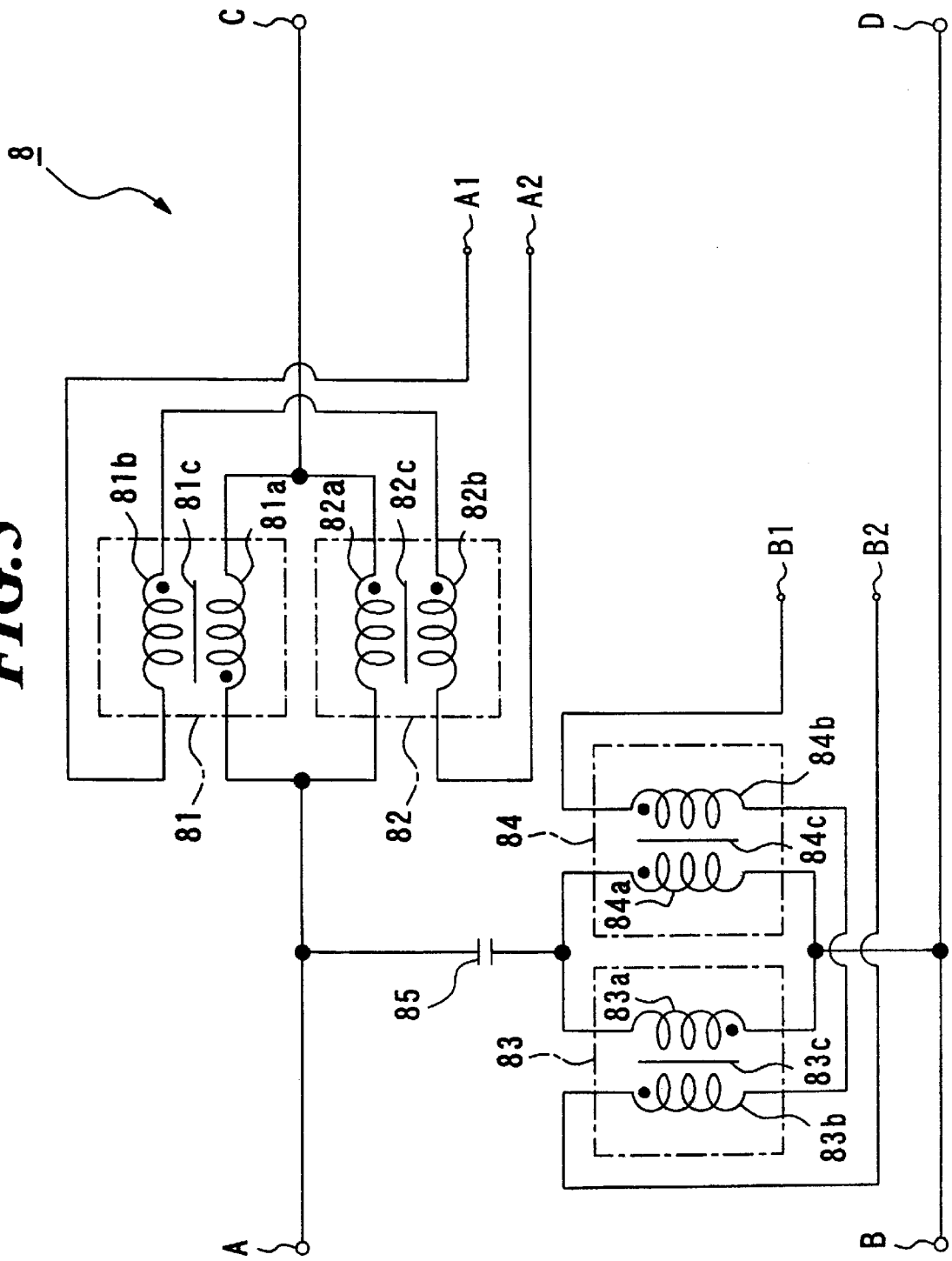
FIG. 5 is a block diagram of the principal circuit portion in the impedance matching device 8.

FIG. 5 is a block diagram of the principal circuit portion in the impedance matching device 8.

The impedance matching device 8 according to the third embodiment is a modification of the impedance matching device 7 according to the second embodiment, which is shown in FIG. 4.

In the impedance matching device according to the second embodiment, the high-frequency components generated by each of the coupled circuits are removed by a pair of coupled circuits (the first coupled circuit 71 and the second coupled circuit 72; the third coupled circuit 73 and the fourth coupled circuit 74) connected in series, to cancel out the high-frequency components generated in each coupled circuit. On the contrary, the impedance matching device according to the third embodiment comprises a pair of coupled circuits connected in parallel, to cancel out the high-frequency components generated in each of the coupled circuits.

The circuit construction of the impedance matching device according to the third embodiment will be explained.

The impedance matching device 8 comprises a first coupled circuit 81, a second coupled circuit 82, a third coupled circuit 83, a fourth coupled circuit 84, and a capacitor 85.

The first coupled circuit 81 comprises a first core 81c, and a first main winding 81a and a first control winding 81b which are wound around the first core 81c.

In the first coupled circuit 81, an end of the first main winding 81a is connected to a terminal "A" and an end of a second main winding 82a which will be described later, of the second coupled circuit 82, and the other end of the first main winding 81a is connected to a terminal "C" and the other end of the second main winding 82a. An end of the first control winding 81b is connected to a terminal "A1", and the other end thereof is connected to an end of a control winding 82b which will be described later, of the second coupled circuit 82. In the first coupled circuit 81, the value of inductance (L) of the first main winding 81a is changed according to the control current which flows in the first control winding 81b from the control circuit.

The second coupled circuit 82 comprises a second core 82c, and a second main winding 82a and a second control winding 82b which are wound around the second core 82c.

In the second coupled circuit 82, an end of the second main winding 82a is connected to the terminal "A" and an end of the first main winding 81a of the first coupled circuit 81, and the other end of the second main winding 82a is connected to a terminal "C" and the other end of the first main winding 81a of the first coupled circuit 81. An end of the second control winding 82b is connected to the other end of the first control winding 81b of the first coupled circuit 81, and the other end of the second control winding 82b is connected to the terminal "A2". In the second coupled circuit 82, the value of inductance (L) of the second main winding 82a is changed according to the control current which flows in the second control winding 82b from the control circuit.

The relationship between the winding directions of the first main winding 81a and of the first control winding 81b, of the first coupled circuit 81 is the reverse of the relationship between the winding directions of the second main winding 82a and of the second control winding 82b, of the second coupled circuit 82. The winding number of the first main winding 81a of the first coupled circuit 81 is equal to that of the second main winding 82a of the second coupled circuit 82; and the winding number of the first control winding 81b of the first coupled circuit 81 is equal to that of the second control winding 82b of the second coupled circuit 82.

Because of the above-described relationships, the direction of the high-frequency component induced in the first control winding 81b by a high-frequency current flowing in the first main winding 81a of the first coupled circuit 81 is the reverse of the direction of the high-frequency component induced in the second control winding 82b by a high-frequency current flowing in the second main winding 82a of the second coupled circuit 82. The magnitude of the high-frequency component induced in the first control winding 81b by a high-frequency current flowing in the first main winding 81a of the first coupled circuit 81 is equal to that of the high-frequency component induced in the second control winding 82b by a high-frequency current flowing in the second main winding 82a of the second coupled circuit 82. As a result, the high-frequency components generated in the first control winding 81b and the second control winding 82b are cancelled and removed, so that it is possible to prevent the high-frequency components from being applied to the control circuit through the terminals A1 and A2.

The third coupled circuit 83 comprises a third core 83c, and a third main winding 83a and a third control winding 83b which are wound around the third core 83c.

In the third coupled circuit 83, an end of the third main winding 83a is connected to an end of a capacitor 85 and an end of the fourth main winding 84a which will be described later, of the fourth coupled circuit 84, and the other end of the third main winding 83a is connected to terminals "B" and "D" and the other end of the fourth main winding 84a which will be described later, of the fourth coupled circuit 84. An end of the third control winding 83b is connected to the terminal "B2" and the other end thereof is connected to an end of a control winding 84b which will be described later, of the fourth coupled circuit 84. In the third coupled circuit 83, the value of inductance (L) of the third main winding 83a is changed according to the control current which flows in the third control winding 83b from the control circuit.

The fourth coupled circuit 84 comprises a fourth core 84c, and a fourth main winding 84a and a fourth control winding 84b which are wound around the fourth core 84c.

In the fourth coupled circuit 84, an end of the fourth main winding 84a is connected to an end of the capacitor 85 and an end of the third main winding 83a of the third coupled circuit 83, and the other end of the fourth main winding 84a is connected to the terminals "B" and "D" and the other end of the third main winding 83a of the third coupled circuit 83. An end of the fourth control winding 84b is connected to the other end of the third control winding 83b and the other end of the fourth control winding 84b is connected to the terminal "B1". In the fourth coupled circuit 84, the value of inductance (L) of the fourth main winding 84a is changed according to the control current which flows in the fourth control winding 84b from the control circuit.

The relationship between the winding directions of the third main winding 83a and of the third control winding 83b, of the third coupled circuit 83 is the reverse of the relationship between the winding directions of the fourth main winding 84a and of the fourth control winding 84b, of the fourth coupled circuit 84. The winding number of the third main winding 83a of the third coupled circuit 83 is equal to that of the fourth main winding 84a of the fourth coupled circuit 84; and the winding number of the third control winding 83b of the third coupled circuit 83 is equal to that of the fourth control winding 84b of the fourth coupled circuit 84.

Because of the above-described relationships, the direction of the high-frequency component induced in the third control winding 83b by a high-frequency current flowing in the third main winding 83a of the third coupled circuit 83 is the reverse of the direction of the high-frequency component induced in the fourth control winding 84b by a high-frequency current flowing in the fourth main winding 84a of the fourth coupled circuit 84. The magnitude of the high-frequency component induced in the third control winding 83b by a high-frequency current flowing in the third main winding 83a of the third coupled circuit 83 is equal to that of the high-frequency component induced in the fourth control winding 84b by a high-frequency current flowing in the fourth main winding 84a of the fourth coupled circuit 84. As a result, the high-frequency components generated in the third control winding 83b and the fourth control winding 84b are cancelled and removed, so that it is possible to prevent the high-frequency components from being applied to the control circuit through the terminals B1 and B2.

An end of the capacitor 85 is connected to an end of the third main winding 83a of the third coupled circuit 83 and an end of the fourth main winding 84a of the fourth coupled circuit 84, and the other end of the capacitor 85 is connected to the terminal "A". The reason for providing the capacitor 85 is the same as in the case of the first embodiment.

In the impedance matching device 8 according to the third embodiment of the invention, the value of inductance (L) of the first main winding 81a of the first coupled circuit 81 is changed depending on the value of the current which flows in the first control winding 81b of the first coupled circuit 81; the value of inductance (L) of the second main winding 82a of the second coupled circuit 82 is changed depending on the value of the current which flows in the second control winding 82b of the second coupled circuit 82; the value of inductance (L) of the third main winding 83a of the third coupled circuit 83 is changed depending on the value of the current which flows in the third control winding 83b of the third coupled circuit 83; and the value of inductance (L) of the fourth main winding 84a of the fourth coupled circuit 84 is changed depending on the value of the current which flows in the fourth control winding 84b of the fourth coupled circuit 84. The impedance matching device 8 matches the impedance of the high-frequency generator 5 with the impedance of the load device 6 by using the inductance phenomenon to change the impedance of the impedance matching device 8.

Detailed explanation for the circuit operation with respect to the impedance matching is omitted because the circuit operation and the idea of the third embodiment are similar to those of the impedance matching device 4 according to the first embodiment.

In the impedance matching device 8 according to the third embodiment of the invention, the impedance of the impedance matching device 8 is changed, by changing the inductance (L) of the first main winding 81a in the first coupled circuit 81 by changing the current value which flows in the first control winding 81b in the first coupled circuit 81, by changing the inductance (L) of the second main winding 82a in the second coupled circuit 82 by changing the current value which flows in the second control winding 82b in the second coupled circuit 82, by changing the inductance (L) of the third main winding 83a in the third coupled circuit 83 by changing the current value which flows in the third control winding 83b in the third coupled circuit 83, and by changing the inductance (L) of the fourth main winding 84a in the fourth coupled circuit 84 by changing the current value which flows in the fourth control winding 84b in the fourth coupled circuit 84, like the impedance matching device 4 according to the first embodiment. As a result, according to the impedance matching device 8 of the third embodiment, it is possible to enable matching of the impedance of the device at a higher speed than a conventional impedance matching device which performs matching by changing the impedance mechanically by using a motor or the like; and it does not require maintenance operations.

Further, because the impedance matching device 8 of the third embodiment does not require first and second low-pass filters 46 and 48 for cutting the high-frequency components which are used in the first embodiment, like the second embodiment, it is possible to decrease the production costs thereof.

Fourth Embodiment

The impedance matching device according to the fourth embodiment of the invention will be explained with reference to FIG. 9.

Before explaining the impedance matching device according to the fourth embodiment, notation for circuits used in the following embodiments and the principle of removal of the high-frequency components will be described with reference to FIGS. 6 and 7.

Figure 6A:
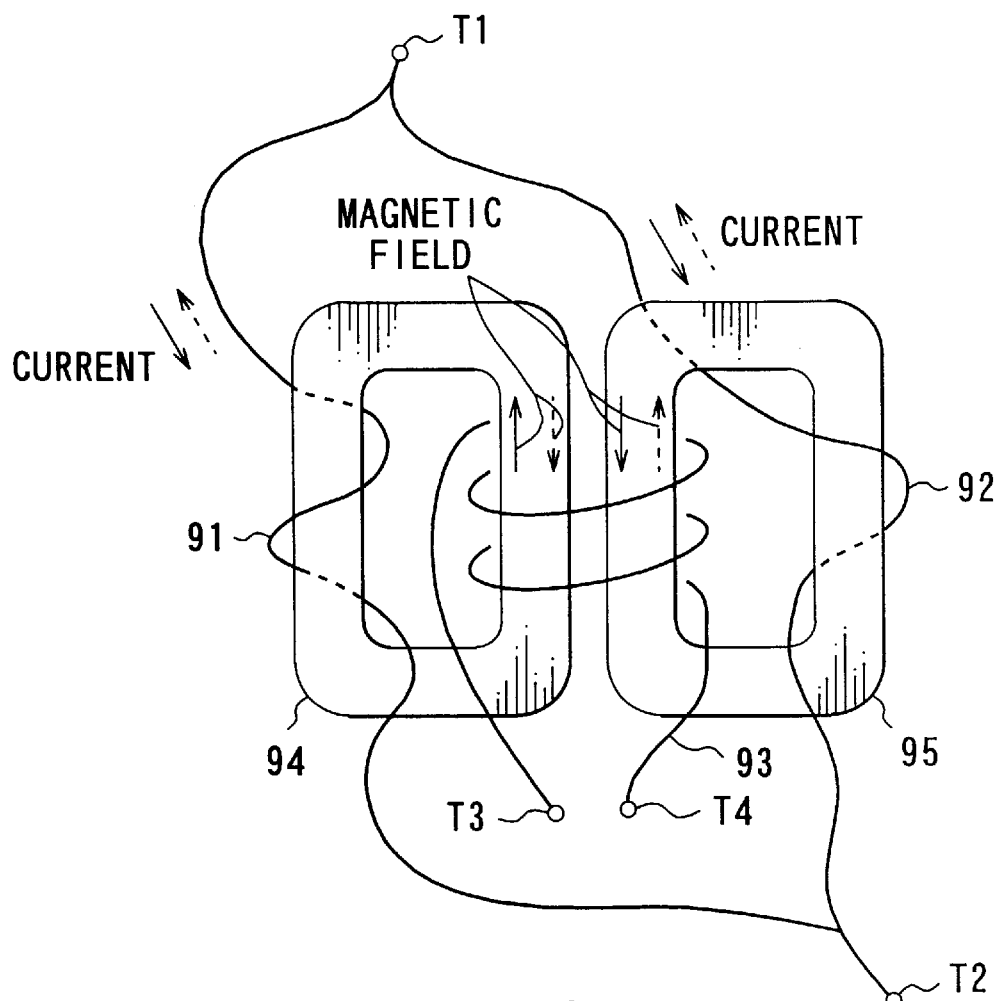
FIG. 6A is a view for showing an example of winding manner of the windings to the core.
Figure 6B:
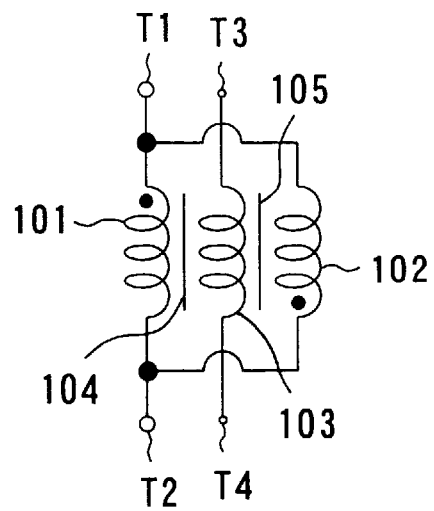
FIG. 6B is a view for explaining the notation of winding manner of the windings to the core shown in FIG. 6A.

FIG. 6A is a view for showing an example of winding manner of the windings to the core. FIG. 6B is a view for explaining the notation of winding manner of the windings to the core shown in FIG. 6A.

The core shown in FIG. 6A comprises first and second toroidal cores 94 and 95. Around the first toroidal core 94, a first main winding 91 is wound, and also around the second toroidal core 95, the second main winding 92 is wound. A control winding 93 is wound around the toroidal cores 94 and 95 so that both the first and second toroidal cores 94 and 95 pass through each turn (term) of the control winding 93. The first and second main windings 91 and 92 are connected equivalently in parallel to each other with respect to the terminals T1 and T2.

In such a construction, when a high-frequency current flows in each of the first and second main windings 91 and 92, although high-frequency components are induced at the control winding 93, the induced high-frequency components at the control winding 93 are cancelled and removed at every term of the control winding 93.

The reason for this will be explained, as follows. When a high-frequency current flows through the first main winding 91 in the direction shown by the solid line in the figure, from the terminal T1 to the terminal T2, an upward magnetic field (in the direction shown by the solid line in the figure) is caused at the portion of the first toroidal core 94 around which the control winding 93 is wound.

On the other hand, when a high-frequency current flows through the second main winding 92 in the direction shown by the solid line in the figure, from the terminal T1 to the terminal T2, a downward magnetic field (in the direction shown by the solid line in the figure) is caused at the portion of the second toroidal core 95 around which the control winding 93 is wound.

As described above, the direction of the magnetic field which is caused by the current flowing through the first main winding 91 and which interlinks with a term of the control winding 93 is the reverse of the direction of the magnetic field which is caused by the current flowing through the second main winding 92 and which interlinks with the term of the control winding 93.

Similarly, when a high-frequency current flows through the first main winding 91 in the direction shown by the dotted line in the figure, from the terminal T2 to the terminal T1, a downward magnetic field (in the direction shown by the dotted line in the figure) is caused at the portion of the toroidal core 94 around which the control winding 93 is wound.

On the other hand, when a high-frequency current flows through the second main winding 92 in the direction shown by the dotted line in the figure, from the terminal T2 to the terminal T1, an upward magnetic field (in the direction shown by the dotted line in the figure) is caused at the portion of the toroidal core 95 around which the control winding 93 is wound.

As described above, the direction of the magnetic field which is caused by the current flowing through the first main winding 91 and which interlinks with a term of the control winding 93 is the reverse of the direction of the magnetic field which is caused by the current flowing through the second main winding 92 and which interlinks with the term of the control winding 93.

As a result, when a high-frequency current flows through the first and second main windings 91 and 92, the high-frequency component induced at the control winding 93 by the current flowing through the first main winding 91 and the high-frequency component induced at the control winding 93 by the current flowing through the second main winding 92 cancel each other and are removed at every term of the control winding 93.

Corresponding relationships between the portions shown in FIG. 6A and the portions shown in FIG. 6B are as follows.

The first toroidal core 94 in FIG. 6A corresponds to the first core 104 in FIG. 6B; and the second toroidal core 95 in FIG. 6A corresponds to the second core 105 in FIG. 6B.

The first main winding 91 in FIG. 6A corresponds to the main winding 101 in FIG. 6B; and the second main winding 92 in FIG. 6A corresponds to the second main winding 102 in FIG. 6B.

The control winding 93 in FIG. 6A corresponds to the control winding 103 in FIG. 6B.

The terminal T1 in FIG. 6A corresponds to the terminal T1 in FIG. 6B; and the terminal T2 in FIG. 6A corresponds to the terminal T2 in FIG. 6B. The terminal T3 in FIG. 6A corresponds to the terminal T3 in FIG. 6B; and the terminal T4 in FIG. 6A corresponds to the terminal T4 in FIG. 6B.

Next, another case will be explained.

Figure 7A:
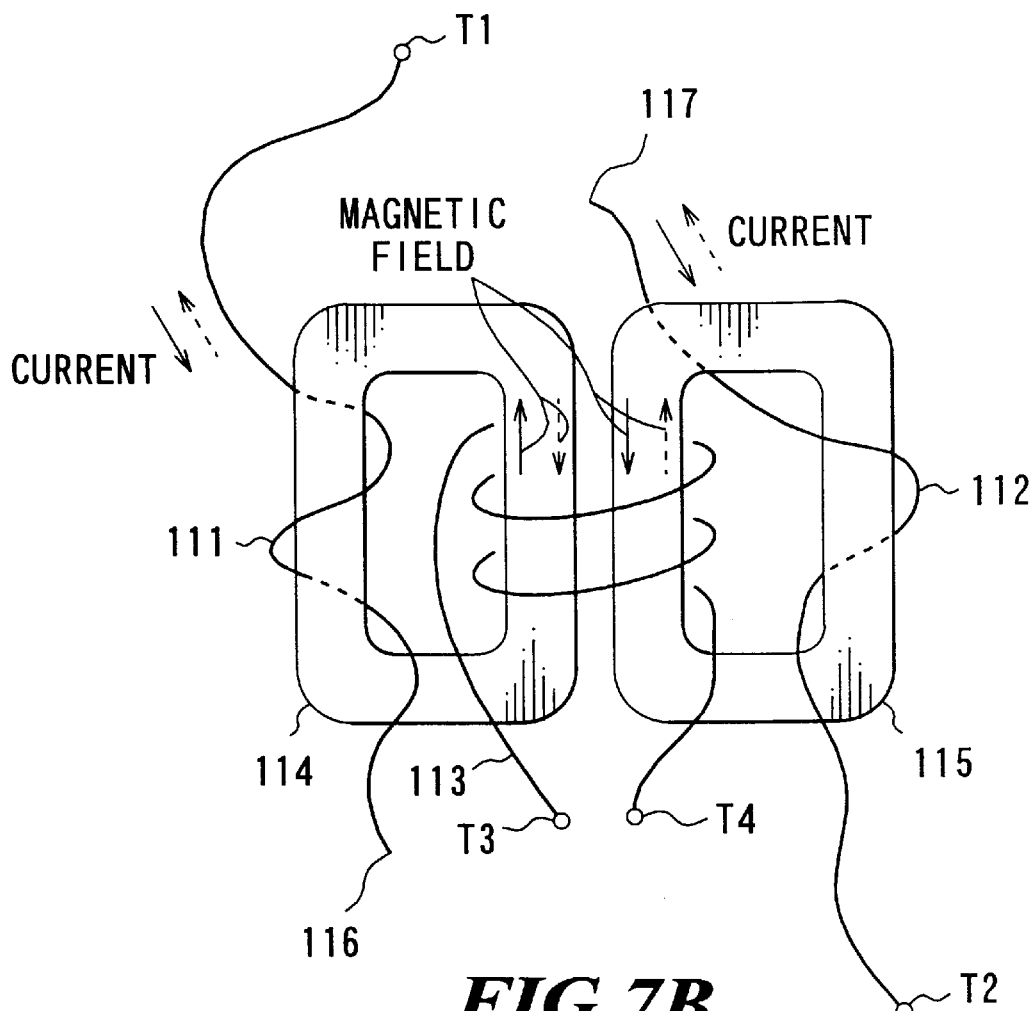
FIG. 7A is a view for showing an example of winding manner of the windings to the core.
Figure 7B:
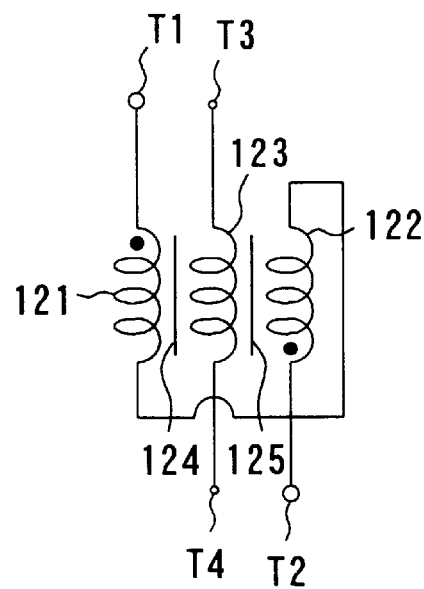
FIG. 7B is a view for explaining the notation of winding manner of the windings to the core shown in FIG. 7A.
Figure 8A:
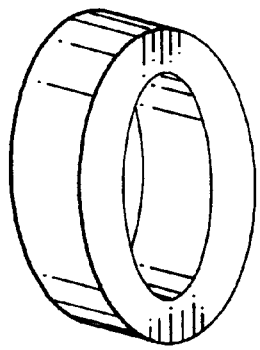
FIGS. 8A to 8D are view for showing various types of shapes of the core.
Figure 8B:
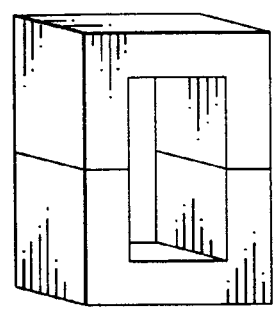
Figure 8C:
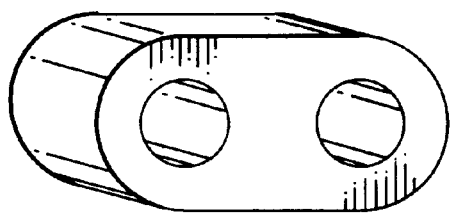
Figure 8D:
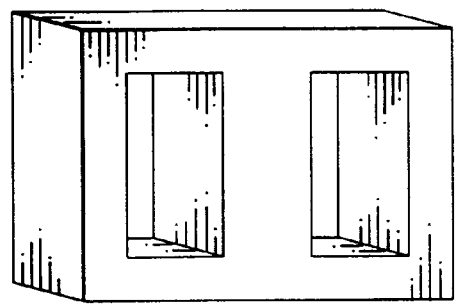

FIG. 7A is a view for showing an example of winding manner of the windings to the core. FIG. 7B is a view for explaining the notation of winding manner of the windings to the core shown in FIG. 7A.

The core shown in FIG. 7A comprises first and second toroidal cores 114 and 115. Around one first toroidal core 114 of them, a first main winding 111 is wound, and also around the second toroidal core 115, the second main winding 112 is wound. A control winding 113 is wound around the first and second toroidal cores 114 and 115 so that both the first and second toroidal cores 114 and 115 pass through each turn (term) of the control winding 113. The first and second main windings 111 and 112 are connected to each other at points 116 and 117 shown in the figure. The first and second main windings 111 and 112 are connected equivalently in series to each other with respect to the terminals T1 and T2.

In such a construction, when a high-frequency current flows in each of the first and second main windings 111 and 112, although high-frequency components are induced at the control winding 113, the induced high-frequency components at the control winding 113 are cancelled and removed at every term of the control winding 113. Because the principle for this is the same as the case of FIG. 6A, the detailed explanation is therefore omitted.

Corresponding relationship between the portions shown in FIG. 7A and the portions shown in FIG. 7B are as follows.

The first toroidal core 114 in FIG. 7A corresponds to the first core 124 in FIG. 7B; and the second toroidal core 115 in FIG. 7A corresponds to the second core 125 in FIG. 7B.

The first main winding 111 in FIG. 7A corresponds to the first main winding 121 in FIG. 7B; and the second main winding 112 in FIG. 7A corresponds to the second main winding 122 in FIG. 7B.

The control winding 113 in FIG. 7A corresponds to the control winding 123 in FIG. 7B.

The terminal T1 in FIG. 7A corresponds to the terminal T1 in FIG. 7B; and the terminal T2 in FIG. 7A corresponds to the terminal T2 in FIG. 7B. The terminal T3 in FIG. 7A corresponds to the terminal T3 in FIG. 7B; and the terminal T4 in FIG. 7A corresponds to the terminal T4 in FIG. 7B.

FIG. 8 are views showing the shapes of cores. In the above-described notation, two toroidal cores shown in FIG. 8A are used. However, two U-shaped cores shown in FIG. 8B may be also used, wherein two main windings and one control winding are wound around the two U-shaped cores. Further, a spectacle core shown in FIG. 8C may be also used. An E-shaped core shown in FIG. 8D may be also used.

Next, the impedance matching device according to the fourth embodiment of the invention will be explained with reference to FIG. 9.

Figure 9:
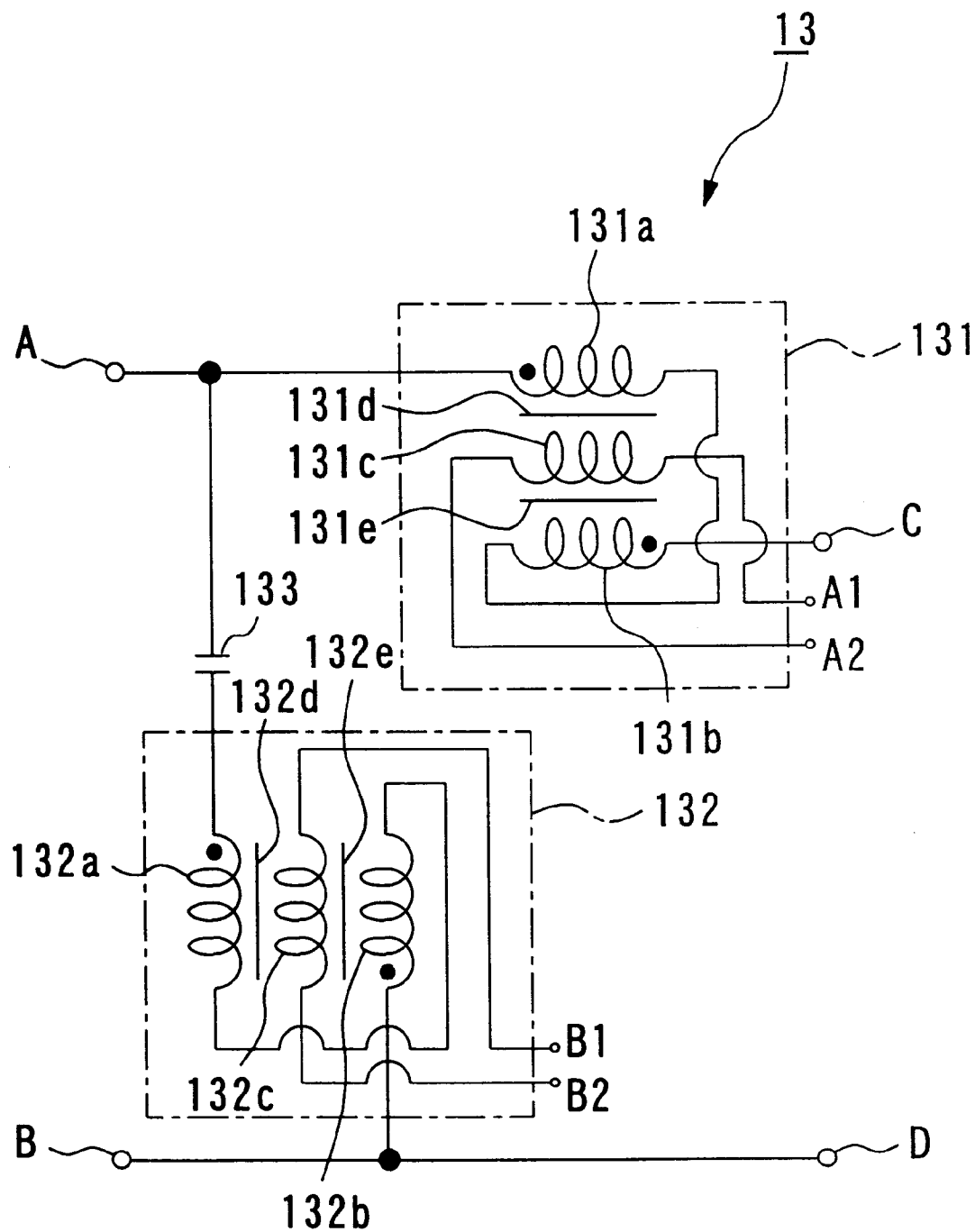
FIG. 9 is a block diagram of the principal circuit portion in the impedance matching device 13.

FIG. 9 is a block diagram of the principal circuit portion in the impedance matching device 13.

In the impedance matching device according to the second embodiment, a pair of coupled circuits (the first and second coupled circuits 71 and 72, and the third and fourth coupled circuits 73 and 74) in which the relationship between the winding directions of the main winding and of the corresponding control winding, of first or third coupled circuit 71 or 73 is the reverse of the relationship between the winding directions of the main winding and of the corresponding control winding, of the second or fourth coupled circuit 72 or 74, are provided to remove by canceling out the high-frequency components generated in each coupled circuit. On the contrary, the impedance matching device according to the fourth embodiment comprises a coupled circuit having a construction shown in FIG. 7 in place of providing a pair of coupled circuits, to cancel out the high-frequency components generated in the control winding at every term of the control winding.

The impedance matching device 13 comprises a first coupled circuit 131, a second coupled circuit 132, and a capacitor 133.

The first coupled circuit 131 having a construction shown in FIG. 7A, comprises first and second main windings 131a and 131b, a first control winding 131c, and first and second cores 131d and 131e.

In the first coupled circuit 131, an end of the first main winding 131a is connected to a terminal "A", and the other end thereof is connected to an end of a main winding 131b. An end of the second main winding 131b is connected to the other end of the first main winding 131a, and the other end thereof is connected to a terminal "C". An end of the first control winding 131c is connected to a terminal "A1", and the other end thereof is connected to a terminal "A2". In the first coupled circuit 131, the values of inductance (L) of the main windings 131a and 131b are changed according to the control current which flows in the first control winding 131c from the control circuit. The winding number of the first main winding 131a is equal to that of the second main winding 131b.

According to the same idea as the above-explanation using FIG. 7A, it is understood that the direction of the high-frequency component induced in the first control winding 131c by a high-frequency current flowing in the first main winding 131a is the reverse of the direction of the high-frequency component induced in the first control winding 131c by a high-frequency current flowing in the second main winding 131b. The magnitude of the high-frequency component induced in the first control winding 131c by a high-frequency current flowing in the first main winding 131a is equal to that of the high-frequency component induced in the first control winding 131c by a high-frequency current flowing in the second main winding 131b. As a result, the high-frequency components generated in the first control winding 131c by high-frequency currents flowing in the main windings 131a and 131b cancel each other and are removed, and thereby it is possible to prevent application of the high-frequency components to the control circuit from the terminals A1 and A2. Further, as described above, because the high-frequency components cancel each other and are removed at every term of the first control winding 131c, a large voltage which was locally generated at the control winding in the case of the second or third embodiment, does not occur at the first control winding 131c.

The second coupled circuit 132 having a construction shown in FIG. 7A, comprises main windings 132a and 132b, a control winding 132c, and cores 132d and 132e.

In the second coupled circuit 132, an end of the third main winding 132a is connected to an end of a capacitor 133, and the other end thereof is connected to an end of a main winding 132b. An end of the fourth main winding 132b is connected to the other end of the third main winding 132a, and the other end thereof is connected to terminals "B" and "D". An end of the second control winding 132c is connected to a terminal "B1", and the other end thereof is connected to a terminal "B2". In the second coupled circuit 132, the values of inductance (L) of the main windings 132a and 132b are changed according to the control current which flows in the second control winding 132c from the control circuit. The winding number of the third main winding 132a is equal to that of the fourth main winding 132b.

According to the same idea as the above-explanation using FIG. 7A, it is understood that the direction of the high-frequency component induced in the second control winding 132c by a high-frequency current flowing in the third main winding 132a is the reverse of the direction of the high-frequency component induced in the second control winding 132c by a high-frequency current lowing in the fourth main winding 132b. The magnitude of the high-frequency component induced in the second control winding 132c by a high-frequency current flowing in the third main winding 132a is equal to that of the high-frequency component induced in the second control winding 132c by a high-frequency current flowing in the fourth main winding 132b. As a result, the high-frequency components generated in the second control winding 132c by high-frequency currents flowing in the main windings 132a and 132b cancel each other and are removed, and thereby it is possible to prevent application of the high-frequency components to the control circuit from the terminals B1 and B2. Further, as described above, because the high-frequency components cancel each other and are removed at every term of the second control winding 132c, a large voltage which was locally generated at the control winding in the case of the second or third embodiment, does not occur at the second control winding 132c.

An end of the capacitor 133 is connected to an end of the third main winding 132a of the second coupled circuit 132 and the other end thereof is connected to the terminal "A". The reason for providing the capacitor 133 is the same as in the case of the first embodiment.

In the impedance matching device 13, the values of inductance (L) of the main windings 131a and 131b of the first coupled circuit 131 is changed depending on the value of the control current which flows in the first control winding 131c of the first coupled circuit 131 from the control circuit; the values of inductance (L) of the main windings 132a and 132b of the second coupled circuit 132 is changed depending on the value of the control current which flows in the second control winding 132c of the second coupled circuit 132 from the control circuit. The impedance matching device 13 matches the impedance of the high-frequency generator 5 with the impedance of the load device 6 by using the phenomenon to change the impedance of the impedance matching device 13.

Detailed explanation for the circuit operation with respect to the impedance matching is omitted because the circuit operation and the idea of the fourth embodiment is similar to those of the impedance matching device 4 according to the first embodiment.

In the impedance matching device 13 according to the fourth embodiment of the invention, the impedance of the impedance matching device 13 is changed by changing the inductance (L) of the first and second main windings 131a and 131b in the first coupled circuit 131 by changing the current value which flows in the first control winding 131c in the first coupled circuit 131, by changing the inductance (L) of the third and fourth main windings 132a and 132b in the second coupled circuit 132 by changing the current value which flows in the second control winding 132c in the second coupled circuit 132, like the impedance matching device 4 according to the first embodiment. As a result, according to the impedance matching device 13 of the fourth embodiment, it is possible to enable matching of the impedance of the device at a higher speed than a conventional impedance matching device which performs matching by changing the impedance mechanically by using a motor or the like; and it does not require maintenance operations.

Further, because the impedance matching device 13 of the fourth embodiment does not require first and second low-pass filters 46 and 48 for cutting the high-frequency components which are used in the first embodiment, like the second embodiment, it is possible to decrease the production costs thereof.

Because the high-frequency components cancel each other and are removed at every term of each control winding, a large voltage does not occur at the first control winding 131c locally.

Fifth Embodiment

The impedance matching device according to the fifth embodiment of the invention will be explained with reference to FIG. 10.

Figure 10:
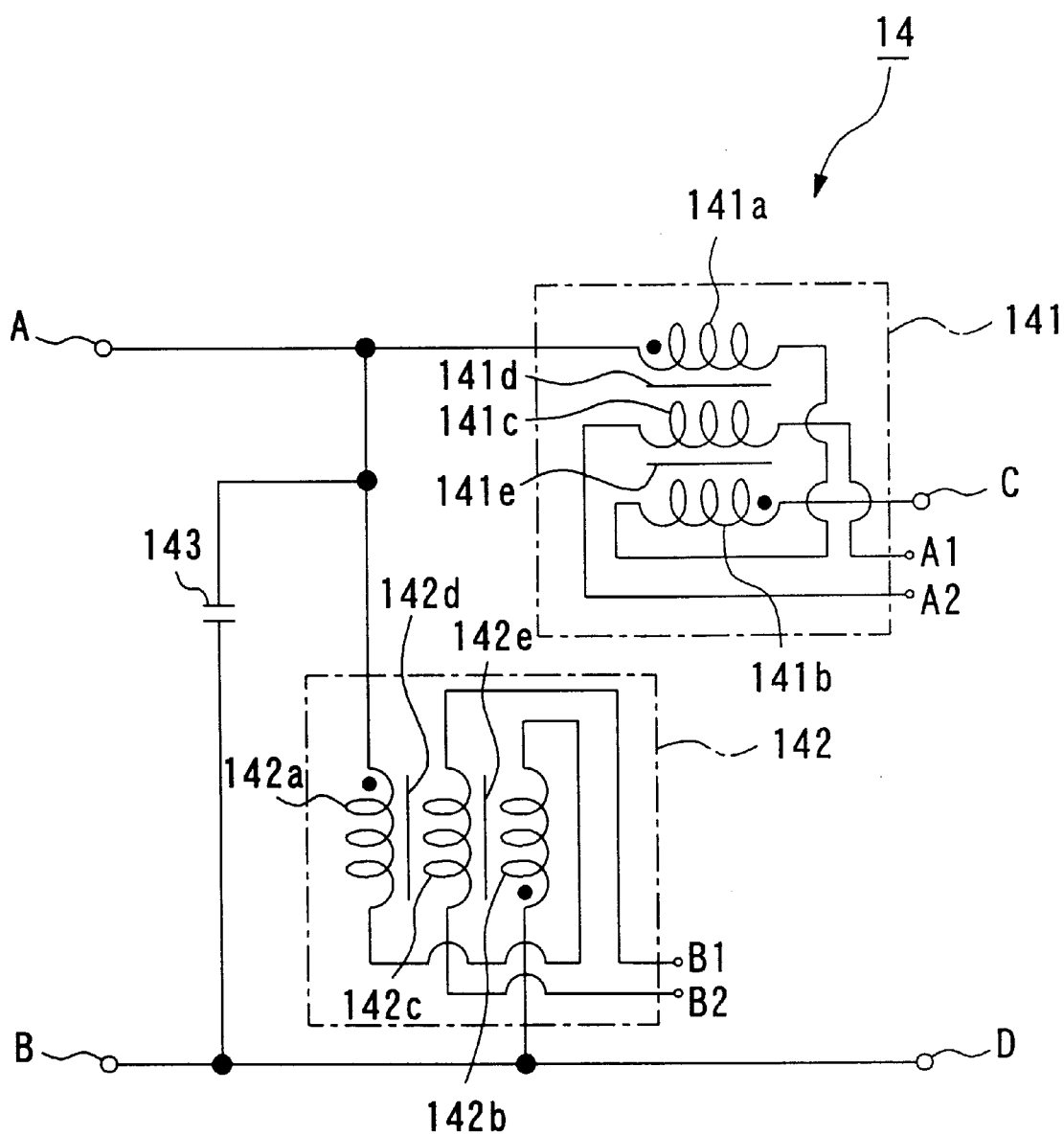
FIG. 10 is a block diagram of the principal circuit portion in the impedance matching device 14.

FIG. 10 is a block diagram of the principal circuit portion in the impedance matching device 14.

The impedance matching device according to the fifth embodiment is a deformed example of the impedance matching device according to the fourth embodiment.

The impedance matching device 14 comprises a first coupled circuit 141, a second coupled circuit 142, and a capacitor 143.

The coupled circuit 141 having a construction shown in FIG. 7A, comprises first and second main windings 141a and 141b, a first control winding 141c, and first and second cores 141d and 141e.

In the coupled circuit 141, an end of the first main winding 141a is connected to a terminal "A", and the other end thereof is connected to an end of a main winding 141b. An end of the second main winding 141b is connected to the other end of the first main winding 141a, and the other end thereof is connected to terminal "C". An end of the first control winding 141c is connected to a terminal "A1", and the other end thereof is connected to a terminal "A2". In the coupled circuit 141, the values of inductance (L) of the main windings 141a and 141b are changed according to the control current which flows in the first control winding 141c from the control circuit. The winding number of the first main winding 141a is equal to that of the second main winding 141b.

According to the same idea as the above-explanation using FIG. 7A, it is understood that the direction of the high-frequency component induced in the first control winding 141c by a high-frequency current flowing in the first main winding 141a is the reverse of the direction of the high-frequency component induced in the first control winding 141c by a high-frequency current flowing in the second main winding 141b. The magnitude of the high-frequency component induced in the first control winding 141c by a high-frequency current flowing in the first main winding 141a is equal to that of the high-frequency component induced in the first control winding 141c by a high-frequency current flowing in the second main winding 141b. As a result, the high-frequency components generated in the first control winding 141c by high-frequency currents flowing in the main windings 141a and 141b cancel each other and are removed, so that it is possible to prevent application of the high-frequency components to the control circuit through the terminals A1 and A2. Further, as described above, because the high-frequency components cancel each other and are removed at every term of the first control winding 141c, a large voltage which was locally generated at the control winding in the case of the second or third embodiment, does not occur at the first control winding 141c.

The coupled circuit 142 having a construction shown in FIG. 7A, comprises main windings 142a and 142b, a control winding 142c, and cores 142d and 142e.

In the coupled circuit 142, an end of the third main winding 142a is connected to a terminal "A", and the other end thereof is connected to an end of a main winding 142b. An end of the fourth main winding 142b is connected to the other end of the third main winding 142a, and the other end thereof is connected to terminals "B" and "D". An end of the second control winding 142c is connected to a terminal "B1", and the other end thereof is connected to a terminal "B2". In the coupled circuit 142, the values of inductance (L) of the third and fourth main windings 142a and 142b are changed according to the control current which flows in the second control winding 142c from the control circuit. The winding number of the third main winding 142a is equal to that of the fourth main winding 142b.

According to the same idea as the above-explanation using FIG. 7A, it is understood that the direction of the high-frequency component induced in the second control winding 142c by a high-frequency current flowing in the third main winding 142a is the reverse of the direction of the high-frequency component induced in the second control winding 142c by a high-frequency current flowing in the fourth main winding 142b. The magnitude of the high-frequency component induced in the second control winding 142c by a high-frequency current flowing in the third main winding 142a is equal to that of the high-frequency component induced in the second control winding 142c by a high-frequency current flowing in the fourth main winding 142b. As a result, the high-frequency components generated in the second control winding 142c by high-frequency currents flowing in the third and fourth main windings 142a and are 142b cancel other and removed, and thereby it is possible to prevent application of the high-frequency components to the control circuit from the terminals B1 and B2. Further, as described above, because the high-frequency components cancel each other and are removed at every term of the second control winding 142c, a large voltage which was locally generated at the control winding in the case of the second or third embodiment, does not occur at the second control winding 142c.

An end of the capacitor 143 is connected to the terminal "A", and the other end thereof is connected to the terminals "B" and "D". The reason for providing the capacitor 143 is the same as in the case of the first embodiment.

In the impedance matching device 14, the values of inductance (L) of the first and second main windings 141a and 141b of the first coupled circuit 141 is changed depending on the value of the control current which flows in the first control winding 141c of the first coupled circuit 141 from the control circuit; the values of inductance (L) of the third and fourth main windings 142a and 142b of the second coupled circuit 142 is changed depending on the value of the control current which flows in the second control winding 142c of the second coupled circuit 142 from the control circuit. The impedance matching device 14 matches the impedance of the high-frequency generator 5 with the impedance of the load device 6 by using the inductance phenomenon to change the impedance of the impedance matching device 14.

Detailed explanation for the circuit operation with respect to the impedance matching is omitted because the circuit operation and the idea of the fifth embodiment is similar to those of the impedance matching device 4 according to the first embodiment.

In the impedance matching device 14 according to the fifth embodiment of the invention, the impedance of the impedance matching device 14 is changed, by changing the inductance (L) of the first and second main windings 141a and 141b in the first coupled circuit 141 by changing the current value which flows in the first control winding 141c in the first coupled circuit 141, by changing the inductance (L) of the third and fourth main windings 142a and 142b in the second coupled circuit 142 by changing the current value which flows in the second control winding 142c in the second coupled circuit 142, like the impedance matching device 4 according to the first embodiment. As a result, according to the impedance matching device 14 of the fifth embodiment, it is possible to enable matching of the impedance of the device at a higher speed than a conventional impedance matching device which performs matching by changing the impedance mechanically by using a motor or the like; and it does not require maintenance operations.

Further, because the impedance matching device 14 of the fifth embodiment does not require first and second low-pass filters 46 and 48 for cutting the high-frequency components which are used in the first embodiment, like the second embodiment, it is possible to decrease the production costs thereof.

Because the high-frequency components cancel each other and are removed at every term of each control winding, like the fourth embodiment, a large voltage does not occur locally at each control winding.

Sixth Embodiment

The impedance matching device according to the sixth embodiment of the invention will be explained with reference to FIG. 11.

Figure 11:
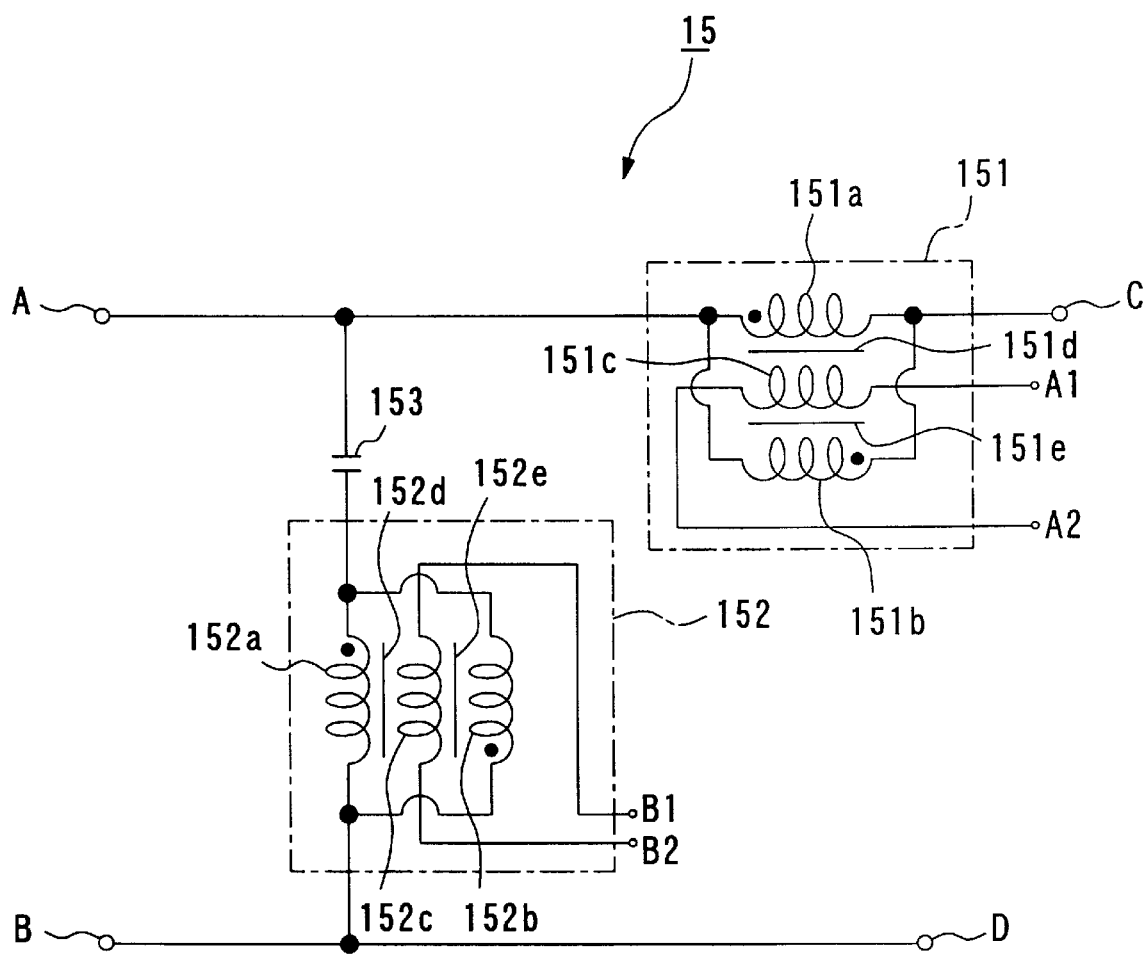
FIG. 11 is a block diagram of the principal circuit portion in the impedance matching device 15.

FIG. 11 is a block diagram of the principal circuit portion in the impedance matching device 15.

The impedance matching device according to the sixth embodiment is another deformed example of the impedance matching device according to the fourth embodiment.

The impedance matching device 15 comprises a first coupled circuit 151, a second coupled circuit 152, and a capacitor 153.

The coupled circuit 151 having a construction shown in FIG. 6A, comprises first and second main windings 151a and 151b, a first control winding 151c, and first and second cores 151d and 151e.

In the first coupled circuit 151, an end of the first main winding 151a is connected to a terminal "A" and an end of the second main winding 151b, and the other end thereof is connected to a terminal "C" and the other end of a main winding 151b. An end of the second main winding 151b is connected to the terminal "A" and an end of the first main winding 151a, and the other end thereof is connected to terminal "C" and the other end of a main winding 151a. An end of the first control winding 151c is connected to a terminal "A1", and the other end thereof is connected to a terminal "A2". In the coupled circuit 151, the values of inductance (L) of the main windings 151a and 151b are changed according to the control current which flows in the first control winding 151c from the control circuit. The winding number of the first main winding 151a is equal to that of the second main winding 151b.

According to the same idea as the above-explanation using FIG. 6A, it is understood that the direction of the high-frequency component induced in the first control winding 151c by a high-frequency current flowing in the first main winding 151a is the reverse of the direction of the high-frequency component induced in the first control winding 151c by a high-frequency current flowing in the second main winding 151b. The magnitude of the high-frequency component induced in the first control winding 151c by a high-frequency current flowing in the first main winding 151a is equal to that of the high-frequency component induced in the first control winding 151c by a high-frequency current flowing in the second main winding 151b. As a result, the high-frequency components generated in the first control winding 151c by high-frequency currents flowing in the first and second main windings 151a and 151b cancel each other and are removed, so that it is possible to prevent application of the high-frequency components to the control circuit through the terminals A1 and A2. Further, as described above, because the high-frequency components cancel each other and are removed at every term of the first control winding 151c, a large voltage which was locally generated at the control winding in the case of the second or third embodiment, does not occur at the first control winding 151c.

The second coupled circuit 152 having a construction shown in FIG. 6A, comprises third and fourth main windings 152a and 152b, a second control winding 152c, and third and fourth cores 152d and 152e.

In the coupled circuit 152, an end of the third main winding 152a is connected to an end of a capacitor 153 and an end of a main winding 152b, and the other end thereof is connected to terminals "B" and "D" and the other end of the fourth main winding 152b. An end of the fourth main winding 152b is connected to an end of the capacitor 153 and an end of the third main winding 152a, and the other end thereof is connected to terminals "B" and "D" and the other end of the third main winding 152a. An end of the second control winding 152c is connected to a terminal "B1", and the other end thereof is connected to a terminal "B2". In the second coupled circuit 152, the values of inductance (L) of the third and fourth main windings 152a and 152b are changed according to the control current which flows in the second control winding 152c from the control circuit. The winding number of the third main winding 152a is equal to that of the fourth main winding 152b.

According to the same idea as the above-explanation using FIG. 6A, it is understood that the direction of the high-frequency component induced in the second control winding 152c by a high-frequency current flowing in the third main winding 152a is the reverse of the direction of the high-frequency component induced in the second control winding 152c by a high-frequency current flowing in the fourth main winding 152b. The magnitude of the high-frequency component induced in the second control winding 152c by a high-frequency current flowing in the third main winding 152a is equal to that of the high-frequency component induced in the second control winding 152c by a high-frequency current flowing in the fourth main winding 152b. As a result, the high-frequency components generated in the second control winding 152c by high-frequency currents flowing in the third and fourth main windings 152a and 152b cancel each other and removed, and are thereby it is possible to prevent application of the high-frequency components to the control circuit from the terminals B1 and B2. Further, as described above, because the high-frequency components cancel each other and are removed at every term of the second control winding 152c, a large voltage which was locally generated at the control winding in the case of the second or third embodiment, does not occur at the second control winding 152c.

An end of the capacitor 153 is connected to an end of the third main winding 152a and an end of the fourth main winding 152b, and the other end thereof is connected to the terminal "A". The reason for providing the capacitor 153 is the same as in the case of the first embodiment.

In the impedance matching device 15, the values of inductance (L) of the first and second main windings 151a and 151b of the first coupled circuit 151 are changed depending on the value of the control current which flows in the first control winding 151c of the first coupled circuit 151 from the control circuit; the values of inductance (L) of the third and fourth main windings 152a and 152b of the second coupled circuit 152 are changed depending on the value of the control current which flows in the second control winding 152c of the second coupled circuit 152 from the control circuit. The impedance matching device 15 matches the impedance of the high-frequency generator 5 with the impedance of the load device 6 by using the inductance phenomenon to change the impedance of the impedance matching device 15.

Detailed explanation for the circuit operation with respect to the impedance matching is omitted because the circuit operation and the idea of the sixth embodiment is similar to those of the impedance matching device 4 according to the first embodiment.

In the impedance matching device 15 according to the sixth embodiment of the invention, the impedance of the impedance matching device 15 is changed by changing the inductance (L) of the first and second main windings 151a and 151b in the coupled circuit 151 by changing the current value which flows in the first control winding 151c in the first coupled circuit 151, by changing the inductance (L) of the third and fourth main windings 152a and 152b in the second coupled circuit 152 by changing the current value which flows in the second control winding 152c in the second coupled circuit 152, like the impedance matching device 4 according to the first embodiment. As a result, according to the impedance matching device 15 of the sixth embodiment, it is possible to enable matching of the impedance of the device at a higher speed than a conventional impedance matching device which performs matching by changing the impedance mechanically by using a motor or the like; and it does not require maintenance operations.

Further, because the impedance matching device 15 of the sixth embodiment does not require first and second low-pass filters 46 and 48 for cutting the high-frequency components which are used in the first embodiment, like the second embodiment, it is possible to decrease the production costs thereof.

Because the high-frequency components cancel each other and are removed at every term of each control winding, like the fourth embodiment, a large voltage does not occur at the control winding locally.

Figure 12A:
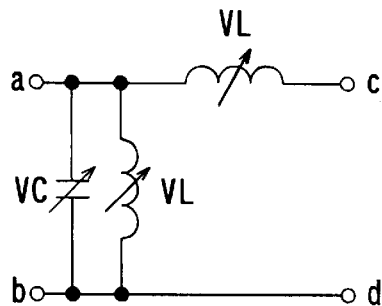
FIGS. 12A to 12H are views showing circuit constructions of the main part of an earlier developed impedance matching device.
Figure 12B:
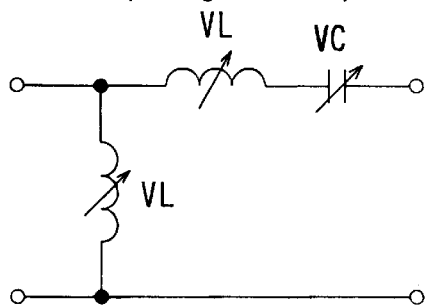
Figure 12C:
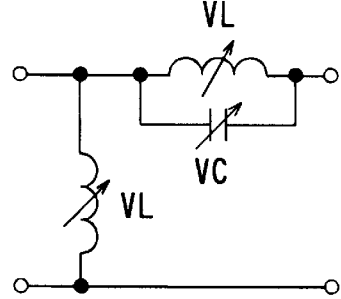
Figure 12D:
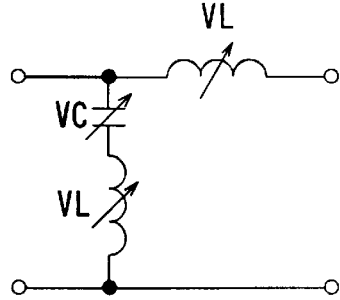
Figure 12E:
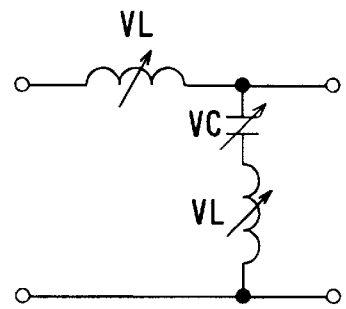
Figure 12F:
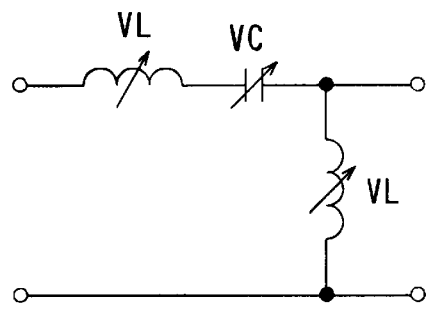
Figure 12G:
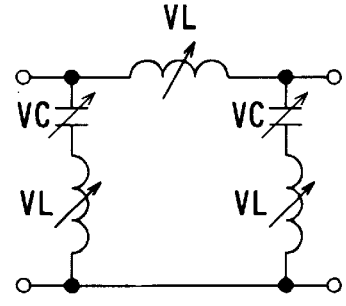
Figure 12H:
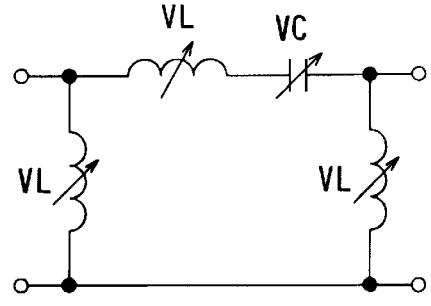

In the above-described first to sixth embodiments, only the impedance matching devices corresponding to the circuit construction shown in FIGS. 12A and 12D are explained. However, it is a matter of course that the impedance matching device according to the invention can have a circuit construction which corresponds to one of the constructions shown in FIGS. 12A to 12H other than FIGS. 12A and 12D and into which the idea contained in the first to sixth embodiments is introduced.

The invention is of high utility value when it is required to match impedance in a manufacturing apparatus for a semiconductor device, a liquid display device or the like; in a vacuum evaporation system used for a vacuum plating process; in a heating and melting apparatus for a plastic material; in an apparatus using a high-frequency wave, e.g., a communication device or the like.

The entire disclosure of Japanese Patent Application No. Tokugan hei-10-338,208 filed on Nov. 27, 1998 including specification, claims, drawings and summary are incorporated herein by reference in its entirety.

What is claimed is:

1. An impedance matching device coupled between a high-frequency generator and a load device for matching an impedance of the high-frequency generator with an impedance of the load device, the device comprising:

a coupled circuit including a core, a main winding, and a control winding which are each wound around the core; and a first low pass filter connected across said control winding, the coupled circuit setting an impedance of the impedance matching device by changing an inductance value of the main winding, said inductance value depending on a magnitude of a direct current flowing in the control winding.

2. The impedance matching device as claimed in claim 1, further comprising:
- a VSWR circuit for measuring a standing wave which is created by a return of a high-frequency voltage reflected from the load device and for adjusting a voltage standing wave ratio on the basis of the measurement result;
- an operating unit for determining a value of direct current to be supplied to the control winding on the basis of the voltage standing wave ratio measured by the VSWR circuit;
- a control current generator for generating a control current having the value of direct current determined by the operating unit and providing the control current to the control winding of the coupled circuit,
- wherein the first low-pass filter prevents application of a high-frequency component induced at the control winding to a side of the control current generator when a high-frequency component is applied to the main winding from the high-frequency generator.

3. The impedance matching device as claimed in claim 1, wherein the coupled circuit includes
- a first coupled circuit having a first core, a first main winding, and a first control winding which are each wound around the first core; and
- a second coupled circuit having a second core, a second main winding, and a second control winding which are each wound around the second core;
- wherein the impedance matching device further includes
  - a VSWR circuit for measuring a standing wave which is created by a return of a high-frequency voltage reflected from the load device and for adjusting a voltage standing wave ratio on the basis of the measurement result;
  - an operating unit for determining a first value of direct current to be supplied to the first control winding and a second value of direct current to be supplied to the second control winding on the basis of the voltage standing wave ratio measured by the VSWR circuit;
  - a first control current generator for generating a first control current having the first value of direct current determined by the operating unit and providing the first control current to the first control winding of the first coupled circuit;
  - a second control current generator for generating a second control current having the second value of direct current determined by the operating unit and providing the second control current to the second control winding of the second coupled circuit;
  - a second low-pass filter for preventing application of a high-frequency component induced at the second control winding to a side of the second control current generator when a high-frequency component is applied to the second main winding from the high-frequency generator,
  - said first low-pass filter preventing application of a high-frequency component induced at the fist control winding to a side of the first control current generator when a high-frequency component is applied to the first main winding from the high-frequency generator; and
  - a capacitor connected between an end of the second main winding and the VSWR circuit.

4. The impedance matching device as claimed in claim 3, wherein each of the first and second low-pass filters is formed by an LC circuit which includes a coil and a capacitor.

5. The impedance matching device as claimed in claim 1, wherein the coupled circuit includes
- a first coupled circuit including a first core, a first main winding, and a first control winding which are each wound around the first core;
- a second coupled circuit which is connected to the first coupled circuit in series and includes a second core, a second main winding, and a second control winding which are each wound around the second core, wherein the first and second main windings are connected to each other and the first and second control windings are connected to each other, and the first and second coupled circuits are arranged so as to cancel a first high-frequency component generated in the first control winding with a second high frequency component generated in the second control winding when a high-frequency current flows in the first and second main windings;
- a third coupled circuit including a third core, a third main winding, and a third control winding which are each wound around the third core; and
- a fourth coupled circuit connected to the third coupled circuit in series and including a fourth core, a fourth main winding, and a fourth control winding which are each wound around the fourth core, wherein the third and fourth main windings are connected to each other and the third and fourth control windings are connected to each other, and the third and fourth coupled circuits are arranged so as to cancel a third high-frequency component generated in the third control winding with a fourth high frequency component generated in the fourth control winding when a high-frequency current flows in the third and fourth main windings;
- wherein the impedance matching device further includes
  - a VSWR circuit for measuring a standing wave which is created by a return of a high-frequency voltage reflected from the load device and for adjusting a voltage standing wave ratio on the basis of the measurement result;
  - an operating unit for determining a first value of direct current to be supplied to the first and second control windings and a second value of direct current to be supplied to the third and fourth control windings on the basis of the voltage standing wave ratio measured by the VSWR circuit;
  - a first control current generator for generating a first control current having the first value of direct current determined by the operating unit and providing the first control current to the first and second control windings of the first and second coupled circuits;
  - a second control current generator for generating a second control current having the second value of direct current determined by the operating unit and providing the second control current to the third and fourth control windings of the third and fourth coupled circuits; and
  - a capacitor connected between an end of the third and fourth main windings and the VSWR circuit.

6. The impedance matching device as claimed in claim 5, wherein a relationship between a winding direction of the first main winding and the first control winding is the reverse of the relationship between a winding direction of the second main winding and the second control winding, and wherein a winding number of the first main winding is equal to a winding number of the second main winding, and a winding number of the first control winding is equal to a winding number of the second control winding.

7. The impedance matching device as claimed in claim 6, wherein a relationship between a winding direction of the third main winding and the third control winding is the reverse of the relationship between a winding direction of the fourth main winding and the fourth control winding, and a winding number of the third main winding is equal to a winding number of the fourth main winding, and a winding number of the third control winding is equal to a winding number of the fourth control winding.

8. The impedance matching device as claimed in claim 1, wherein the coupled circuit includes
   a first coupled circuit which includes a first core, a first main winding, and a first control winding which are wound around the first core;
   a second coupled circuit which is connected to the first coupled circuit in parallel and includes a second core, a second main winding, and a second control winding which are wound around the second core, wherein the first and second main windings are connected to each other and the first and second control windings are connected to each other, and the first and second coupled circuits are arranged so as to cancel a first high-frequency component generated in the first control winding with a second high-frequency component generated in the second control winding when a high-frequency current flows in the first and second main windings;
   a third coupled circuit including a third core, a third main winding, and a third control winding which are each wound around the third core; and
   a fourth coupled circuit connected, to the third coupled circuit in parallel and including a fourth core, a fourth main winding, and a fourth control winding which are each wound around the fourth core, wherein the third and fourth main windings are connected to each other and the third and fourth control windings are connected to each other, and the third and fourth coupled circuits are arranged so as to cancel a third high-frequency component generated in the third control winding with a fourth high-freguency component generated in the fourth control winding when a high-frequency current flows in the third and fourth main windings;
   wherein the impedance matching device further includes
      a VSWR circuit for measuring a standing wave which is created by a return of a high-frequency voltage reflected from the load device and for adjusting a voltage standing wave ratio on the basis of the measurement result;
      an operating unit for determining a first value of direct current to be supplied to the first and second control windings and a second value of direct current to be supplied to the third and fourth control windings on the basis of the voltage standing wave ratio measured by the VSWR circuit;
      a first control current generator for generating a first control current having the first value of direct current determined by the operating unit and providing the first control current to the first and second control windings of the first and second coupled circuits;
      a second control current generator for generating a second control current having the second value of direct current determined by the operating unit and providing the second control current to the third and fourth control windings of the third and fourth coupled circuits; and
      a capacitor connected between an end of the third and fourth main windings and the VSWR circuit.

9. The impedance matching device as claimed in claim 8, wherein a relationship between a winding direction of the first main winding and the first control winding is the reverse of the relationship between a winding direction of the second main winding and the second control winding, and wherein a winding number of the first main winding is equal to that of the second main winding, and a winding number of the first control winding is equal to a winding number of the second control winding.

10. The impedance matching device as claimed in claim 8, wherein a relationship between a winding direction of the third main winding and the third control winding is the reverse of the relationship between a winding direction of the fourth main winding and the fourth control winding, and a winding number of the third main winding is equal to a winding number of the fourth main winding, and a winding number of the third control winding is equal to a winding number of the fourth control winding.

11. An impedance matching device connected between a high-frequency generator and a load device, for matching an impedance of the high-frequency generator with an impedance of the load device, the device comprising:
   a first coupled circuit including a first core, a first main winding wound around the first core, a second core, a second main winding wound around the second core, and a first control winding wound around the first and second cores, both the first and second cores passing through each turn of the first control winding;
   a capacitor coupled across the high-frequency generator, connected at a first end to said first coupled circuit; and
   a VSWR circuit connected to the high-frequency generator and the first coupled circuit, said VSWR circuit measuring a standing wave created by a return of a high frequency voltage reflected from the load device, and adjusting a voltage standing wave ratio on the basis of the measurement result, wherein an impedance of the impedance matching device is changed by changing an inductance value of each of the first and second main windings, said inductance value depending on a magnitude of a direct current flowing in the first control winding.

12. The impedance matching device as claimed in claim 11, wherein the first and second cores, the first and second main windings, and the first control winding are arranged so as to cancel a first high-frequency component generated in the control winding by a high-frequency current flowing in the first main winding with a second high-frequency component generated in the control winding by a high-frequency current flowing in the second main winding.

13. The impedance matching device as claimed in claim 11, wherein a winding number of the first main winding is equal to a winding number of the second main winding.

14. The impedance matching device as claimed in claim 11, wherein the first and second cores comprise adjacent first and second toroidal cores, and the first control winding is wound around adjacent portions of each of the first and second toroidal cores, and the first and second main windings are respectively wound around distant portions of the first and second toroidal cores in reverse direction to each other, and are connected with each other in parallel.

15. The impedance matching device as claimed in claim 11, wherein the first and second cores comprise adjacent first and second toroidal cores, and the first control winding is wound around adjacent portions of each of the first and second toroidal cores, and the first and second main windings are wound respectively around distant portions of the first and second toroidal cores in reverse direction to each other, and are connected with each other in series.

16. The impedance matching device as claimed in claim 11, further comprising:
- a second coupled circuit including a third core, a third main winding wound around the third core, a fourth core, a fourth main winding wound around the fourth core, and a second control winding wound around the third and fourth cores, both the third and fourth cores passing through each turn of the second control winding;
- wherein an impedance of the impedance matching device is changed by changing an inductance value of each of the first and second main windings and each of the third and fourth main windings, said inductance value depending on magnitudes of direct currents flowing in each of the first and second control windings, respectively;
- an operating unit for determining a first value of direct current to be supplied to the first control winding and a second value of direct current to be supplied to the second control winding on the basis of the voltage standing wave ratio measured by the VSWR circuit;
- a first control current generator for generating a first control current having the first value of direct current determined by the operating unit and providing the first control current to the first control winding of the first coupled circuit;
- a second control current generator for generating a second control current having the second value of direct current determined by the operating unit and providing the second control current to the second control winding of the second coupled circuit; and
- a capacitor connected between an end of the third and fourth main windings and the VSWR circuit,
- wherein high-frequency components generated in the first control winding by high-frequency currents flowing in the first and second main windings cancel each other at every term of the first control winding when a high-frequency component is applied to the first and second main windings.

17. The impedance matching device as claimed in claim 16, wherein high-frequency components generated in the second control winding by high-frequency currents flowing in the third and fourth main windings cancel each other at every term of the second control winding when a high-frequency component is applied to the third and fourth main windings.

18. The impedance matching device as claimed in claim 11, further comprising:
- a second coupled circuit including a third core, a third main winding wound around the third core, a fourth core, a fourth main winding wound around the fourth core, and a second control winding wound around the third and fourth cores, both the third and fourth cores passing through each turn of the second control winding,
- wherein an impedance of the impedance matching device is changed by changing an inductance value of each of the first and second main windings and the third and fourth main windings, said inductance value depending on magnitudes of direct currents flowing in the first and second control windings, respectively;
- a VSWR circuit for measuring a standing wave which is created by a return of a high-frequency voltage reflected from the load device and for adjusting a voltage standing wave ratio on the basis of the measurement result;
- an operating unit for determining a first-value of direct current to be supplied to the first control winding and a second value of direct current to be supplied to the second control winding on the basis of the voltage standing wave ratio measured by the VSWR circuit;
- a first control current generator for generating a first control current having the first value of direct current determined by the operating unit and providing the second control current to the first control winding of the first coupled circuit;
- a second control current generator for generating a second control current having the second value of direct current determined by the operating unit and providing the second control current to the second control winding of the second coupled circuit,
- wherein the capacitor is connected at said first end to an end of said second coupled circuit and at a second end to an opposite end of the second coupled circuit, wherein high-frequency components generated in the first control winding by high-frequency currents flowing in the first and second main windings cancel each other at every term of the first control winding when a high-frequency component is applied to the first and second main windings.

19. The impedance matching device as claimed in claim 18, wherein high-frequency components generated in the second control winding by high-frequency currents flowing in the third and fourth main windings cancel each other at every term of the second control winding when a high-frequency component is applied to the third and fourth main windings.

* * * * *